(12) United States Patent
Chang et al.

(10) Patent No.: US 12,349,446 B2
(45) Date of Patent: Jul. 1, 2025

(54) STRUCTURE AND FORMATION METHOD OF SEMICONDUCTOR DEVICE WITH EPITAXIAL STRUCTURES

(71) Applicant: TAIWAN SEMICONDUCTOR MANUFACTURING COMPANY, LTD., Hsinchu (TW)

(72) Inventors: Tun-Jen Chang, Hsinchu (TW); Tung-Heng Hsieh, Hsinchu County (TW); Bao-Ru Young, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 498 days.

(21) Appl. No.: 17/744,999

(22) Filed: May 16, 2022

(65) Prior Publication Data
US 2023/0369131 A1    Nov. 16, 2023

(51) Int. Cl.
*H10D 84/03* (2025.01)
*H10D 84/01* (2025.01)
*H10D 84/85* (2025.01)

(52) U.S. Cl.
CPC ......... *H10D 84/038* (2025.01); *H10D 84/017* (2025.01); *H10D 84/0193* (2025.01); *H10D 84/853* (2025.01)

(58) Field of Classification Search
CPC ..... H01L 21/823821; H01L 21/823814; H01L 27/0924; H01L 29/165; H01L 29/41725; H01L 29/7848; H01L 27/092; H01L 29/0673; H01L 29/0847; H01L 29/42392; H01L 29/66545; H01L 29/775; H01L 29/78696; H01L 29/66439; H01L 21/823807; B82Y 10/00; H10D 84/038; H10D 84/017; H10D 84/0193; H10D 84/853; H10D 30/6757; H10D 30/797; H10D 30/014; H10D 30/43; H10D 30/6735; H10D 64/017; H10D 62/822;
(Continued)

(56) References Cited

U.S. PATENT DOCUMENTS 8,836,016 B2    9/2014  Wu et al.
8,841,701 B2    9/2014  Lin et al.
8,847,293 B2    9/2014  Lee et al.
(Continued)

*Primary Examiner* — Karen Kusumakar
*Assistant Examiner* — Adam S Bowen
(74) *Attorney, Agent, or Firm* — Birch, Stewart, Kolasch & Birch, LLP

(57) ABSTRACT

A semiconductor device structure and a formation method are provided. The method includes forming a first fin structure, a second fin structure, a third fin structure, and a fourth fin structure over a substrate. The second fin structure is between the first fin structure and the third fin structure, and the third fin structure is between the second fin structure and the fourth fin structure. A first lateral distance between the first and the second fin structures is greater than a second lateral distance between the third and the fourth fin structures. The method also includes forming a first p-type epitaxial structure over the first fin structure and forming a second p-type epitaxial structure over the second fin structure. The method further includes forming a first n-type epitaxial structure over the third fin structure and forming a second n-type epitaxial structure over the fourth fin structure.

20 Claims, 26 Drawing Sheets

(58) Field of Classification Search
CPC .. H10D 64/251; H10D 62/121; H10D 62/151; H10D 84/85; H10D 84/0167
See application file for complete search history.

(56) References Cited

U.S. PATENT DOCUMENTS

| | | | |
|---|---|---|---|
| 8,853,025 | B2 | 10/2014 | Zhang et al. |
| 8,962,400 | B2 | 2/2015 | Tsai et al. |
| 9,093,514 | B2 | 7/2015 | Tsai et al. |
| 9,236,267 | B2 | 1/2016 | De et al. |
| 9,245,805 | B2 | 1/2016 | Yeh et al. |
| 9,520,482 | B1 | 12/2016 | Chang et al. |
| 9,576,814 | B2 | 2/2017 | Wu et al. |
| 2021/0098311 | A1* | 4/2021 | Lin .................. H01L 21/30604 |

* cited by examiner

STRUCTURE AND FORMATION METHOD OF SEMICONDUCTOR DEVICE WITH EPITAXIAL STRUCTURES

BACKGROUND

The semiconductor integrated circuit (IC) industry has experienced rapid growth. Technological advances in IC materials and design have produced generations of ICs. Each generation has smaller and more complex circuits than the previous generation.

Over the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
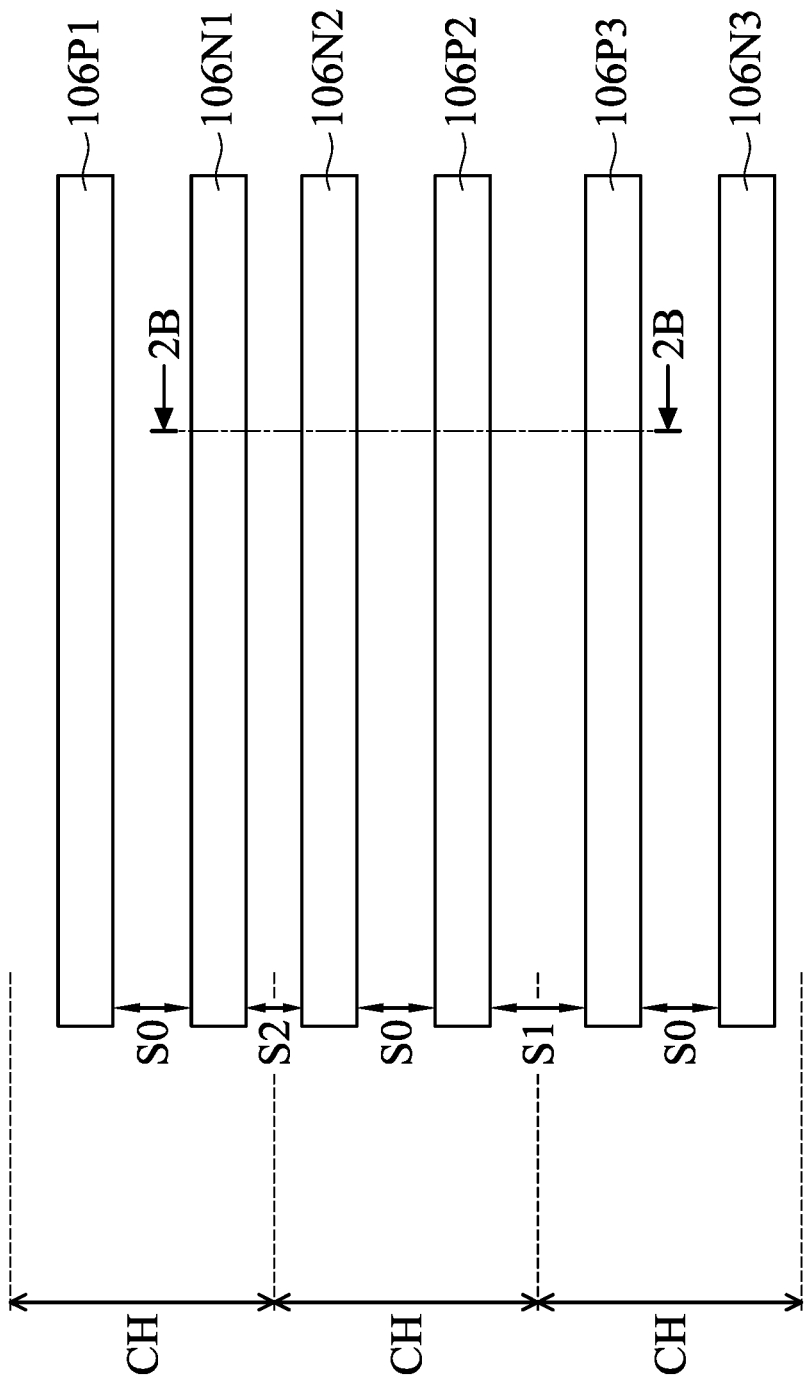
FIGS. 1A-1B are top views of various stages of a process for forming a portion of a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below." "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100% of what is specified. Furthermore, terms such as "substantially parallel" or "substantially perpendicular" are to be interpreted as not to exclude insignificant deviation from the specified arrangement and may include for example deviations of up to 10 degrees in some embodiments. The word "substantially" does not exclude "completely" e.g. a composition which is "substantially free" from Y may be completely free from Y in some embodiments.

Terms such as "about" in conjunction with a specific distance or size are to be interpreted so as not to exclude insignificant deviation from the specified distance or size and may include for example deviations of up to 10% of what is specified in some embodiments. The term "about" in relation to a numerical value x may mean x±5 or 10% of what is specified in some embodiments.

Embodiments of the disclosure may relate to FinFET structure having fins. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned using any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 2A:
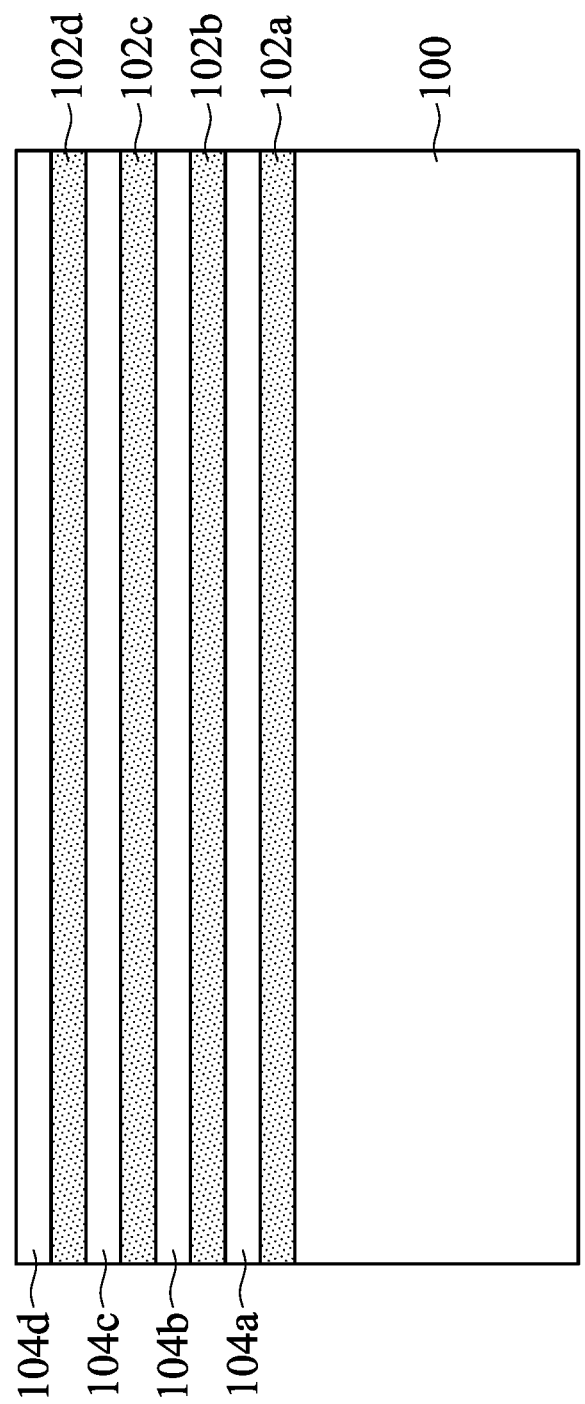
FIGS. 2A-2D are cross-sectional views of various stages of a process for forming a portion of a semiconductor device structure, in accordance with some embodiments.

FIGS. 2A-2D are cross-sectional views of various stages of a process for forming a portion of a semiconductor device structure, in accordance with some embodiments. As shown in FIG. 2A, a semiconductor substrate 100 is received or provided. In some embodiments, the semiconductor substrate 100 is a bulk semiconductor substrate, such as a semiconductor wafer. The semiconductor substrate 100 may include silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 2A, a semiconductor stack having multiple semiconductor layers is formed over the semiconductor substrate 100, in accordance with some embodiments. In some embodiments, the semiconductor stack includes multiple semiconductor layers 102a, 102b, 102c, and 102d. The semiconductor stack also includes multiple semiconductor layers 104a, 104b, 104c, and 104d. In some embodiments, the semiconductor layers 102a-102d and the semiconductor layers 104a-104d are laid out alternately, as shown in FIG. 2A.

In some embodiments, the semiconductor layers 102a-102d function as sacrificial layers that will be removed in a subsequent process to release the semiconductor layers 104a-104d. The semiconductor layers 104a-104d that are released may function as channel structures of one or more transistors.

In some embodiments, the semiconductor layers 104a-104d that will be used to form channel structures are made of a material that is different than that of the semiconductor layers 102a-102d. In some embodiments, the semiconductor layers 104a-104d are made of or include silicon, germanium, other suitable materials, or a combination thereof. In some embodiments, the semiconductor layers 102a-102d are made of or include silicon germanium. In some other embodiments, the semiconductor layers 104a-104d are made of silicon germanium, and the semiconductor layers 102a-102d are made of silicon germanium with different atomic concentration of germanium than that of the semiconductor layers 104a-104d. As a result, different etching selectivity and/or different oxidation rates during subsequent processing may be achieved between the semiconductor layers 102a-102d and the semiconductor layers 104a-104d.

The present disclosure contemplates that the semiconductor layers 102a-102d and the semiconductor layers 104a-104d include any combination of semiconductor materials that can provide desired etching selectivity, desired oxidation rate differences, and/or desired performance characteristics (e.g., materials that maximize current flow).

In some embodiments, the semiconductor layers 102a-102d and 104a-104d are formed using multiple epitaxial growth operations. Each of the semiconductor layers 102a-102d and 104a-104d may be formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 102a-102d and 104a-104d are grown in-situ in the same process chamber. In some embodiments, the growth of the semiconductor layers 102a-102d and 104a-104d are alternately and sequentially performed in the same process chamber to complete the formation of the semiconductor stack. In some embodiments, the vacuum of the process chamber is not broken before the epitaxial growth of the semiconductor stack is accomplished.

Afterwards, hard mask elements are formed over the semiconductor stack to assist in a subsequent patterning of the semiconductor stack. Each of the hard mask elements may include a first mask layer 108 and a second mask layer 110. The first mask layer 108 and the second mask layer 110 may be made of different materials. One or more photolithography processes and one or more etching processes are used to pattern the semiconductor stack into multiple fin structures. The fin structures may be patterned by any suitable method. For example, the fin structures may be patterned using one or more photolithography processes, including double-patterning or multi-patterning processes. Double-patterning or multi-patterning processes may combine photolithography and self-aligned processes, allowing patterns to be created that have, for example, pitches smaller than what is otherwise obtainable using a single, direct photolithography process.

Figure 2B:
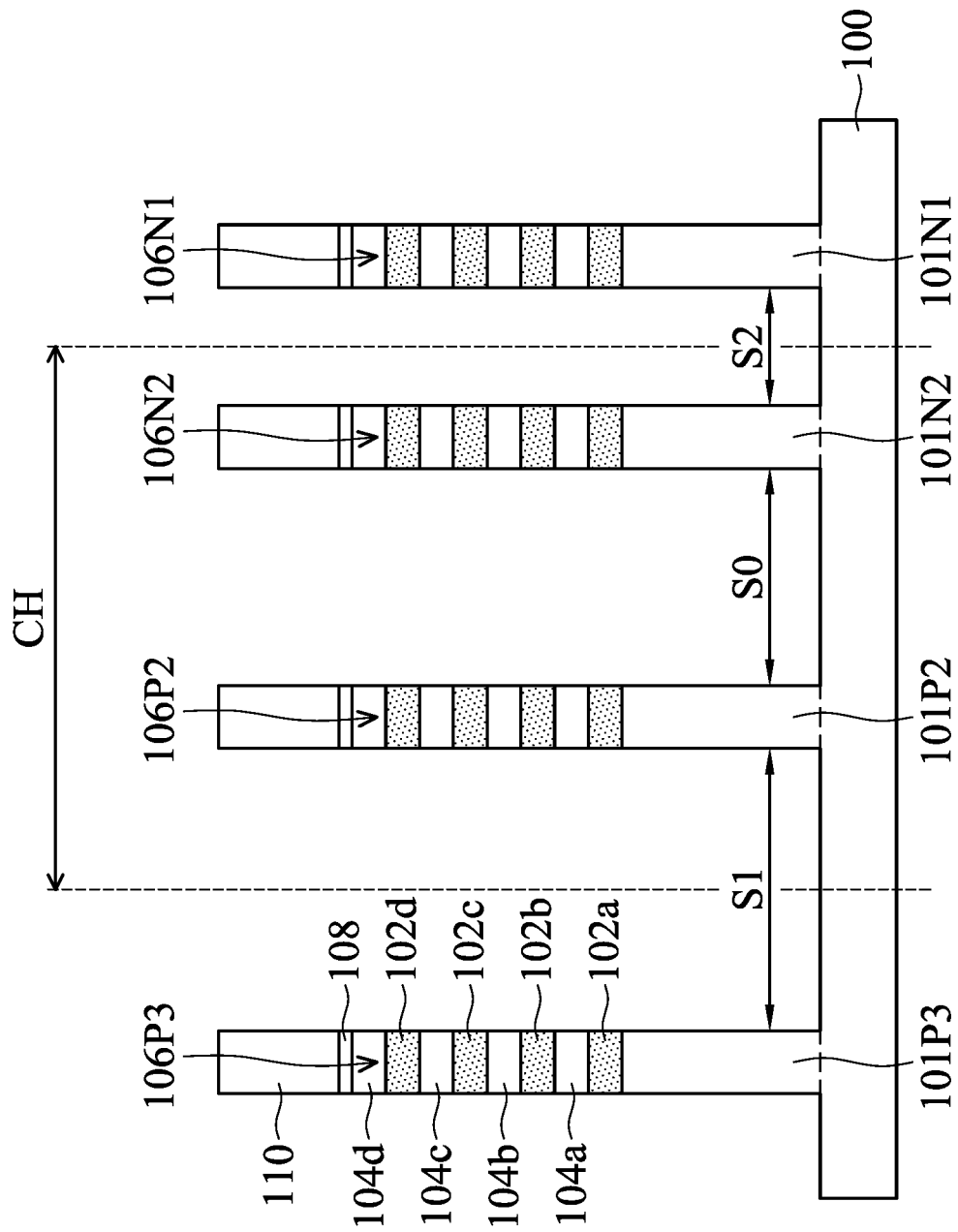

The semiconductor stack is partially removed to form multiple trenches, as shown in FIG. 2B. Each of the fin structures may include portions of the semiconductor layers 102a-102d and 104a-104d and multiple semiconductor fins (including semiconductor fins 101P3, 101P2, 101N2 and 101N1), as shown in FIG. 2B. The semiconductor substrate 100 may also be partially removed during the etching process that forms the fin structures. Protruding portions of the semiconductor substrate 100 that remain form the semiconductor fins 101P3, 101P2, 101N2 and 101N1.

Figure 1B:
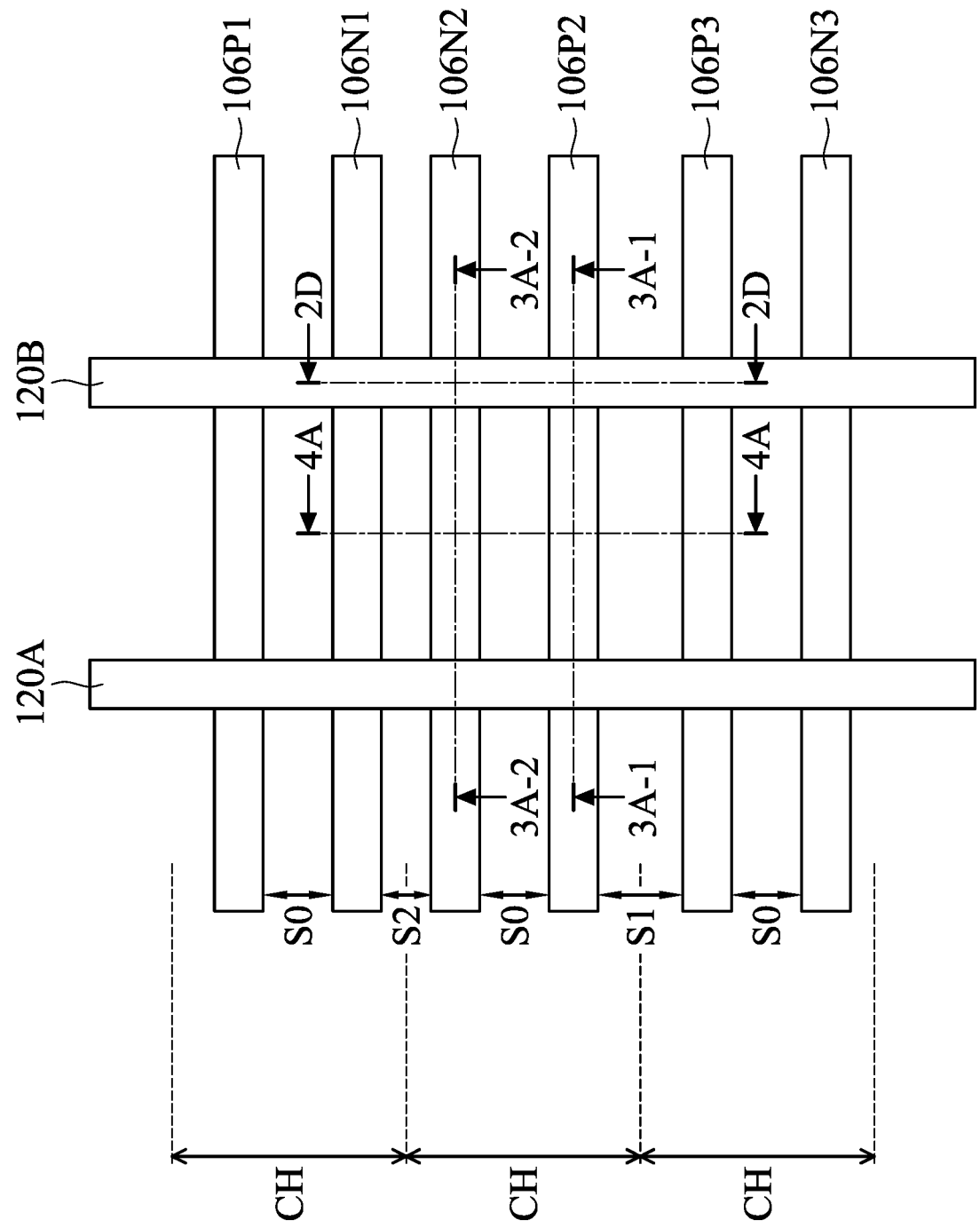

FIGS. 1A-1B are top views of various stages of a process for forming a portion of a semiconductor device structure, in accordance with some embodiments. As shown in FIG. 1A, multiple fin structures 106P1, 106N1, 106N2, 106P2, 106P3, and 106N3 are formed, in accordance with some embodiments. In some embodiments, the fin structures 106P1, 106N1, 106N2, 106P2, 106P3, and 106N3 are oriented lengthwise. In some embodiments, the extending directions of the fin structures 106P1, 106N1, 106N2, 106P2, 106P3, and 106N3 are substantially parallel to each other, as shown in FIG. 1A. In some embodiments, FIG. 2B is a cross-sectional view of the structure taken along the line 2B-2B in FIG. 1A.

In some embodiments, portions of the fin structures 106P1 and 106N1 together define a first cell with the cell height CH, as shown in FIG. 1A. Similarly, portions of the fin structures 106N2 and 106P2 together define a second cell with the cell height CH, and portions of the fin structures 106P3 and 106N3 together define a third cell with the cell height CH. In some embodiments, these fin structures are arranged in an asymmetric manner while maintaining the cell height CH. As shown in FIGS. 1A and 2B, the lateral distances between the nearby fin structures are different from each other, in accordance with some embodiments.

As shown in FIGS. 1A and 2B, the fin structures 106P2 and 106P3 are separated from each other by the lateral distance S1, and the fin structures 106N1 and 106N2 are separated from each other by the lateral distance S2. In some embodiments, the lateral distance S1 is greater than the lateral distance S2. As shown in FIGS. 1A and 2B, the fin structures 106P2 and 106N2 are separated from each other by the lateral distance S0. Similarly, the fin structures 106P1 and 106N1 (or 106P3 and 106N3) are also separated from each other by the lateral distance S0. In some embodiments, the lateral distance S0 is greater than the lateral distance S2. In some embodiments, the lateral distance S0 is shorter than the lateral distance S1. The lateral distance S0 may be in a range from about 30 nm to about 80 nm.

In some embodiments, the lateral distance S0 is greater than the lateral distance S2 by a first difference, and the lateral distance S1 is greater than the lateral distance S0 by a second difference. In some embodiments, the first difference is substantially equal to the second difference. The first difference (or the second difference) may be in a range from 1 nm to about 20 nm. In some embodiments, the ratio (S1/S0) of the lateral distance S1 to the lateral distance S0 is in a range from about 1.05 to about 1.2. In some embodiments, the ratio (S2/S0) of the lateral distance S2 to the lateral distance S0 is in a range from about 0.8 to about 0.95.

In some cases, if the ratio (S1/S0) is lower than about 1.05, the subsequently formed epitaxial structures on the fin structures 106P3 and 106P2 may undesirably merge together. In some other cases, if the ratio (S1/S0) is greater than about 1.2, the lateral distance S2 may become too short since the cell height CH stays the same. As a result, the subsequently formed epitaxial structures on the fin structures 106N2 and 106N1 may merge together, which would be undesirable.

Similarly, in some cases, if the ratio (S2/S0) is lower than about 0.8, the subsequently formed epitaxial structures on the fin structures 106N2 and 106N1 may merge together, which would be an undesirable outcome. In some other cases, if the ratio (S2/S0) is greater than about 0.95, the lateral distance S1 may become too small since the cell height CH stays the same. As a result, the subsequently formed epitaxial structures on the fin structures 106P3 and 106P2 may merge together, which would be undesirable.

Figure 2C:
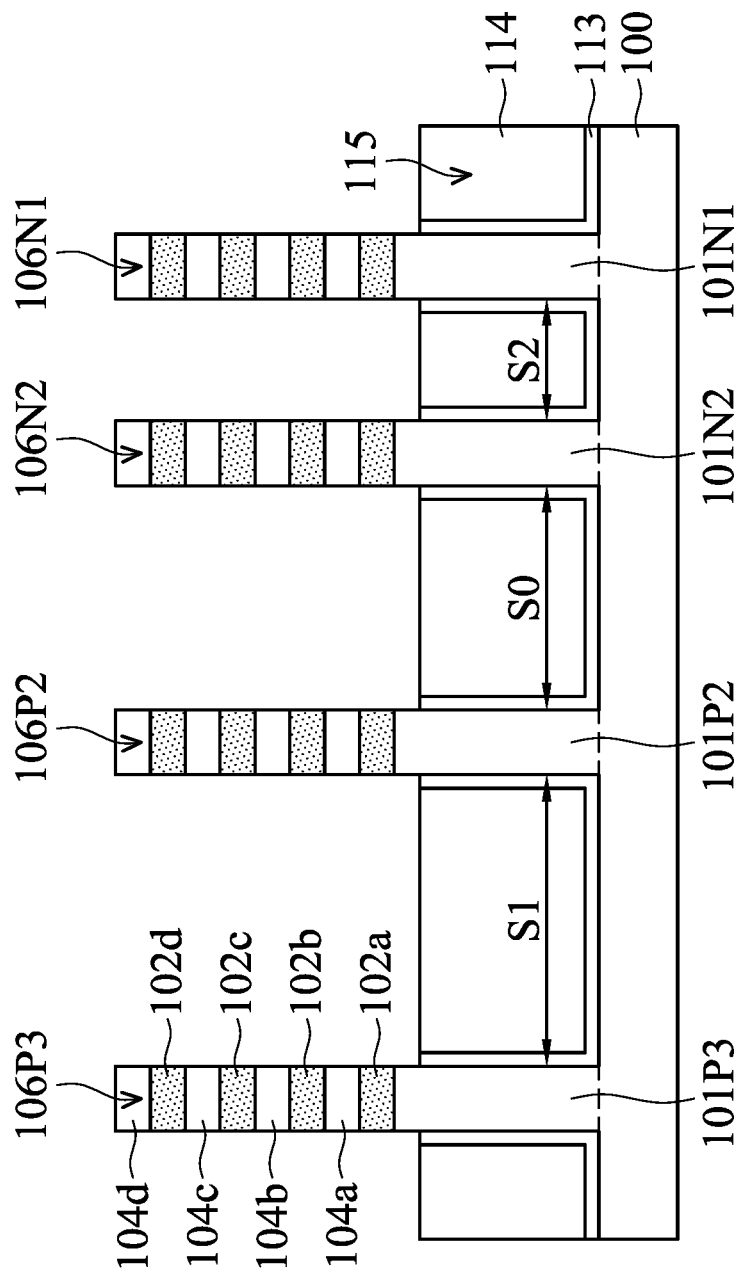

Afterwards, as shown in FIG. 2C, an isolation structure 115 is formed to surround lower portions of the fin structures 106P3, 106P2, 106N2, and 106N1, in accordance with some embodiments. In some embodiments, the isolation structure 115 includes dielectric fillings 114 and a liner layer 113 that is adjacent to the semiconductor fins 101P3, 101P2, 101N2, and 101N1.

In some embodiments, one or more dielectric layers are deposited over the fin structures 106P3, 106P2, 106N2, and 106N1 and the semiconductor substrate 100. The dielectric layers for forming the dielectric fillings 114 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof. The liner layer 113 may be made of or include silicon nitride, silicon oxynitride, silicon carbide, silicon oxycarbide, one or more other suitable materials, or a combination thereof. The dielectric layers and the liner layer 113 may be deposited using a flowable chemical vapor deposition (FCVD) process, an atomic layer deposition (ALD) process, a chemical vapor deposition (CVD) process, one or more other applicable processes, or a combination thereof.

Afterwards, a planarization process is used to partially remove the dielectric layers and the liner layer 113. The hard mask elements (including the first mask layer 108 and the second mask layer 110) may also function as a stop layer of the planarization process. The planarization process may include a chemical mechanical polishing (CMP) process, a grinding process, a dry polishing process, an etching process, one or more other applicable processes, or a combination thereof.

Afterwards, one or more etching back processes are used to partially remove the dielectric layers and the liner layer 113. As a result, the remaining portion of the dielectric layers forms the dielectric fillings 114 of the isolation structure 115. Upper portions of the fin structures 106P3, 106P2, 106N2, and 106N1 protrude from the top surface of the isolation structure 115, as shown in FIG. 2C.

In some embodiments, the etching back process for forming the isolation structure 115 is carefully controlled to ensure that the topmost surface of the isolation structure 115 is positioned at a suitable height level, as shown in FIG. 2C. In some embodiments, the topmost surface of the isolation structure 115 is below the bottommost surface of the semiconductor layer 102a that functions as a sacrificial layer.

Afterwards, the hard mask elements (including the first mask layer 108 and the second mask layer 110) are removed. Alternatively, in some other embodiments, the hard mask elements are removed or consumed during the planarization process and/or the etching back process that forms the isolation structure 115.

Figure 2D:
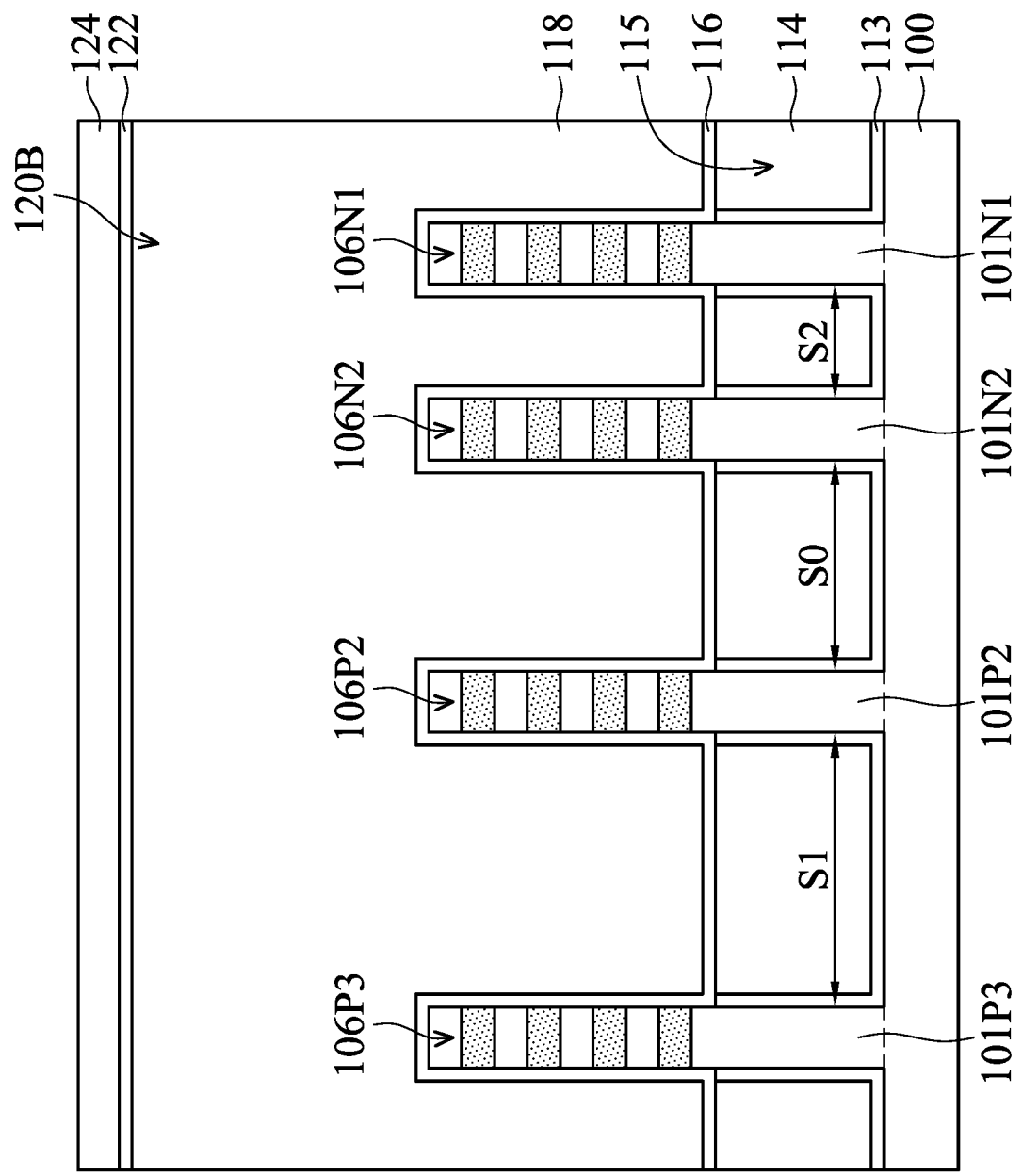
Figure 3A:
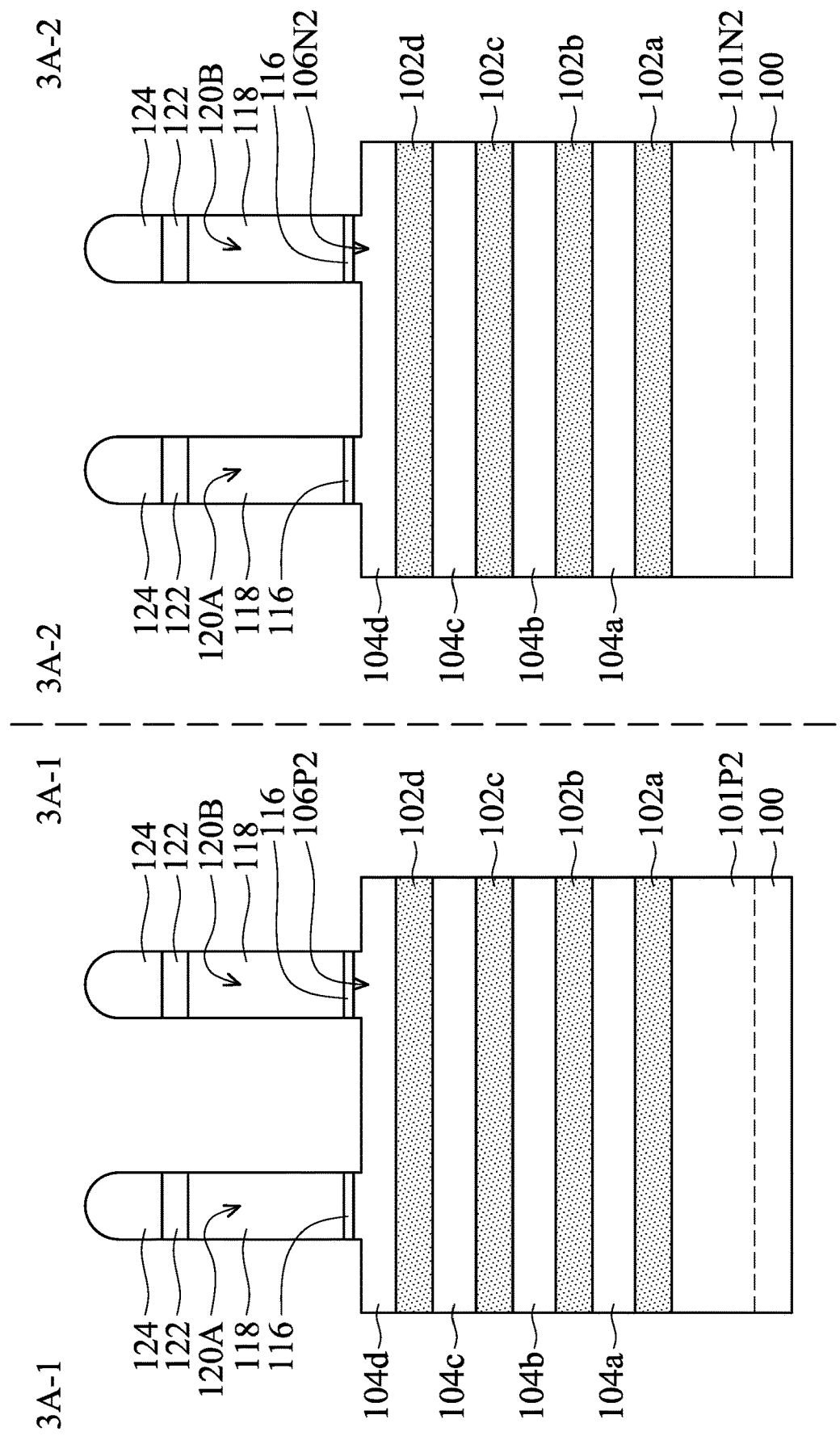
FIGS. 3A-3L are cross-sectional views of various stages of a process for forming a portion of a semiconductor device structure, in accordance with some embodiments.

Afterwards, dummy gate stacks 120A and 120B are formed to extend across the fin structures 106P1-106P3 and 106N1-106N3, as shown in FIG. 1B in accordance with some embodiments. In some embodiments, FIG. 2D is a cross-sectional view of the structure taken along the line 2D-2D in FIG. 1B. FIGS. 3A-3L are cross-sectional views of various stages of a process for forming a portion of a semiconductor device structure, in accordance with some embodiments. In some embodiments, FIG. 3A is a cross-sectional view of the structure taken along the lines 3A-1 to 3A-1 and 3A-2 to 3A-2 in FIG. 1B. FIGS. 4A-4H are cross-sectional views of various stages of a process for forming a portion of a semiconductor device structure, in accordance with some embodiments. In some embodiments, FIG. 4A is a cross-sectional view of the structure taken along the line 4A-4A in FIG. 1B.

As shown in FIGS. 1B, 2D, and 3A, the dummy gate stacks 120A and 120B are formed to partially cover and to extend across the fin structures 106P1-106P3 and 106N1-106N3, in accordance with some embodiments. In some embodiments, the dummy gate stacks 120A and 120B wraps around the fin structures 106P1-106P3 and 106N1-106N3. As shown in FIG. 2D, the dummy gate stack 120B extends across and is wrapped around the fin structures 106P3, 106P2, 106N2, and 106N1. As shown in FIGS. 1B and 4A, other portions of the fin structures 106P1-106P3 and 106N1-106N3 are exposed without being covered by the dummy gate stack 120A or 120B.

As shown in FIGS. 2D and 3A, each of the dummy gate stacks 120A and 120B includes a dummy gate dielectric layer 116 and a dummy gate electrode 118. The dummy gate dielectric layer 116 may be made of or include silicon oxide or another suitable material. The dummy gate electrodes 118 may be made of or include polysilicon or another suitable material.

In some embodiments, a dummy gate dielectric material layer and a dummy gate electrode layer are sequentially deposited over the isolation structure 115 and the fin structures 106P1-106P3 and 106N1-106N3. The dummy gate dielectric material layer may be deposited using an ALD process, a CVD process, one or more other applicable processes, or a combination thereof. The dummy gate electrode layer may be deposited using a CVD process. Afterwards, the dummy gate dielectric material layer and the dummy gate electrode layer are patterned to form the dummy gate stacks 120A and 120B.

In some embodiments, hard mask elements including mask layers 122 and 124 are used to assist in the patterning process for forming the dummy gate stacks 120A and 120B. With the hard mask elements as an etching mask, one or more etching processes are used to partially remove the dummy gate dielectric material layer and the dummy gate electrode layer. As a result, remaining portions of the dummy gate dielectric material layer and the dummy gate electrode layer form the dummy gate stacks 120A and 120B.

Figure 3B:
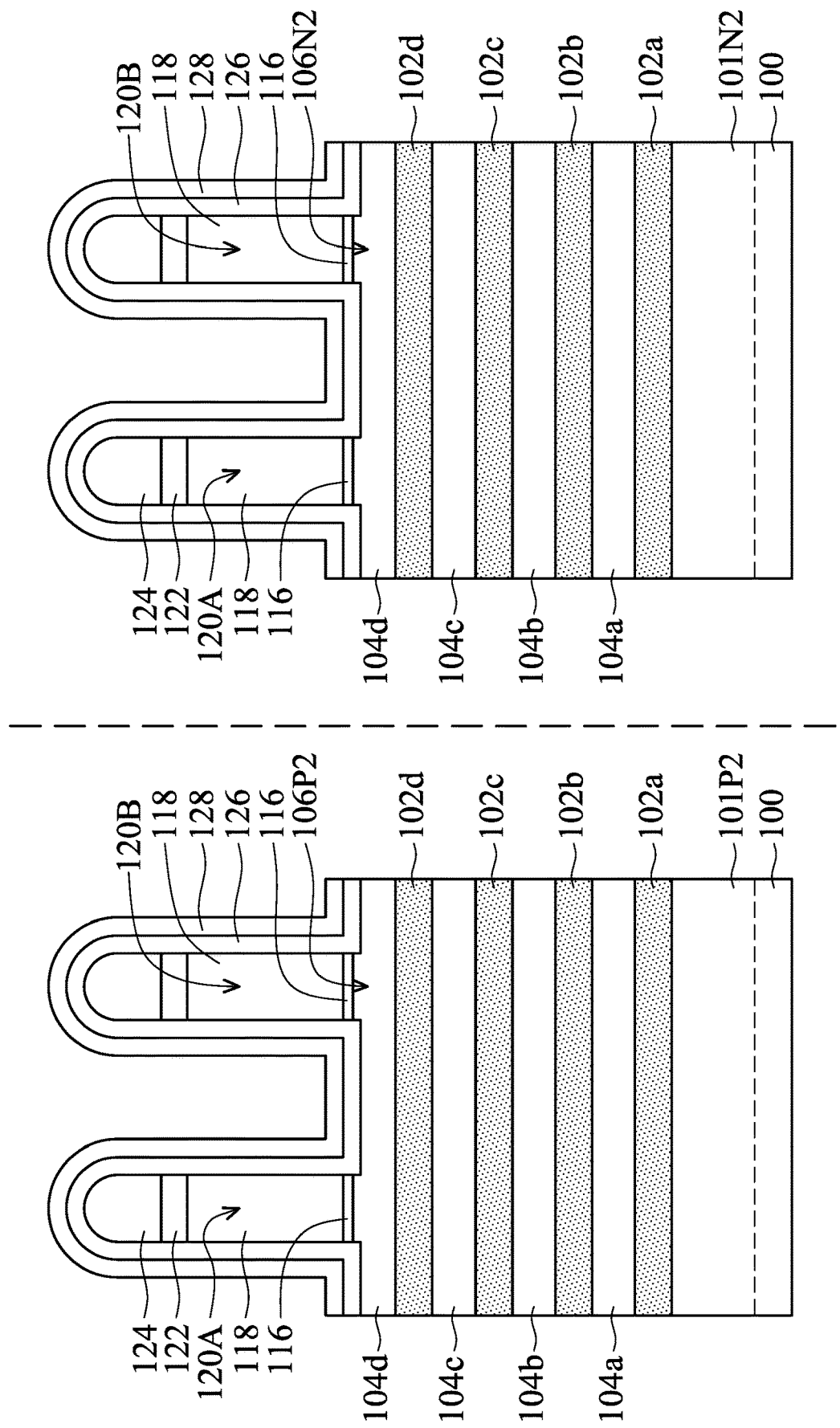
Figure 4A:
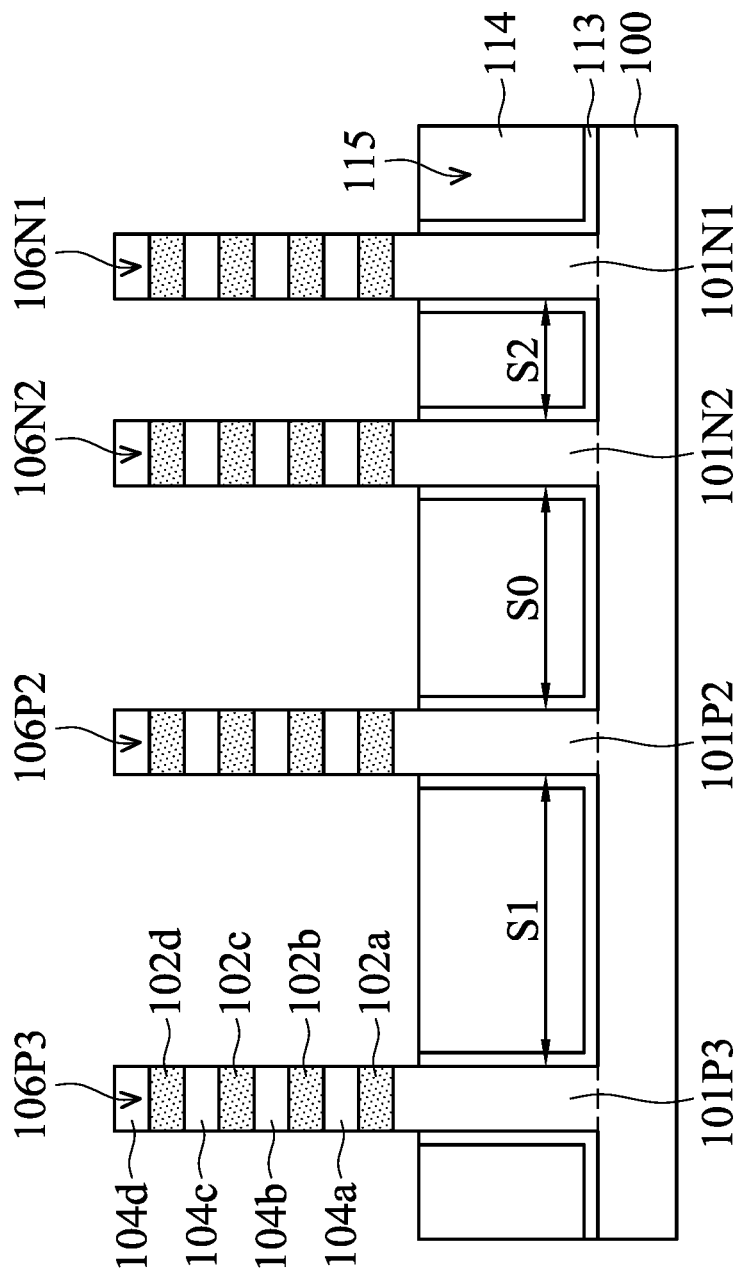
FIGS. 4A-4H are cross-sectional views of various stages of a process for forming a portion of a semiconductor device structure, in accordance with some embodiments.

As shown in FIG. 3B, spacer layers 126 and 128 are afterwards deposited over the dummy gate stacks 120A and 120B and the fin structures including the fin structures 106P2 and 106N2, in accordance with some embodiments. The spacer layers 126 and 128 extend along the tops and sidewalls of the dummy gate stacks 120A and 120B, as shown in FIG. 3B.

In some embodiments, the spacer layers 126 and 128 are made of different materials. The spacer layer 126 may be made of a dielectric material that has a low dielectric constant. The spacer layer 126 may be made of or include silicon carbide, silicon oxycarbide, carbon-containing silicon oxynitride, silicon oxide, one or more other suitable materials, or a combination thereof. In some embodiments, the spacer layer 126 is a single layer. In some other embodiments, the spacer layer 126 includes multiple sub-layers. Some of the sub-layers may be made of different materials. Some of the sub-layers may be made of similar materials with different compositions. For example, one of the sub-layers may have a greater atomic concentration of carbon than other sub-layers.

The spacer layer 128 may be made of a dielectric material that can provide more protection to the gate stacks during subsequent processes. The spacer layer 128 may have a greater dielectric constant than that of the spacer layer 126. The spacer layer 128 may be made of silicon nitride, silicon oxynitride, carbon-containing silicon nitride, carbon-containing silicon oxynitride, one or more other suitable materials, or a combination thereof. The spacer layers 126 and 128 may be sequentially deposited using a CVD process, an ALD process, a physical vapor deposition (PVD) process, one or more other applicable processes, or a combination thereof.

However, embodiments of the disclosure are not limited thereto. Many variations and/or modifications can be made to embodiments of the disclosure. In some other embodiments, the spacer layers 126 and 128 are made of the same material.

Figure 3C:
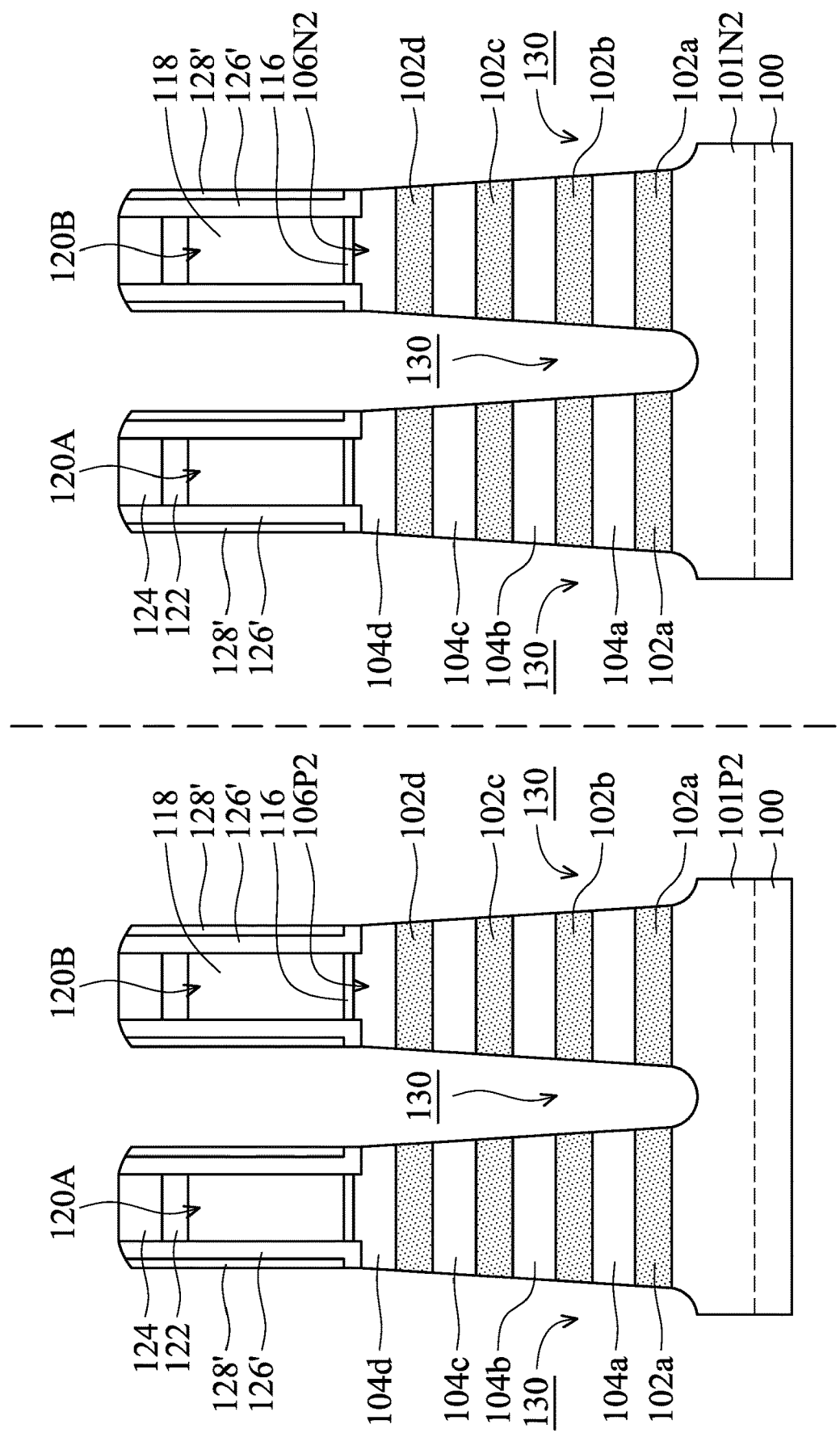

As shown in FIG. 3C, the spacer layers 126 and 128 are partially removed, in accordance with some embodiments. One or more anisotropic etching processes may be used to partially remove the spacer layers 126 and 128. As a result, remaining portions of the spacer layers 126 and 128 form spacer elements 126' and 128', respectively. The spacer elements 126' and 128' extend along the sidewalls of the dummy gate stacks 120A and 120B, as shown in FIG. 3C.

Figure 4B:
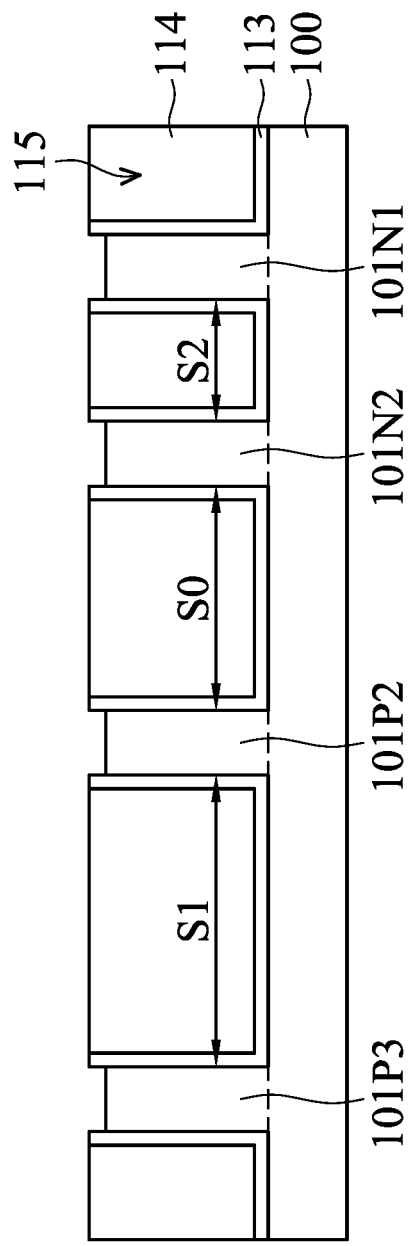

As shown in FIGS. 3C and 4B, the fin structure 106P3, 106P2, 106N2, and 106N1 are partially removed, in accordance with some embodiments. As a result, the recesses 130 are formed, as shown in FIG. 3C. The recesses 130 may be used to contain epitaxial structures (such as source/drain structures) that will be formed later. One or more etching processes may be used to form the recesses 130. In some embodiments, a dry etching process is used to form the recesses 130. Alternatively, a wet etching process may be used to form the recesses 130. In some embodiments, the recesses 130 penetrate into the fin structures 106P2 and 106N2. In some embodiments, the recesses 130 further extend into the semiconductor fins 101P2 and 101N2, as shown in FIG. 3C. In some embodiments, the spacer elements 126' and 128' and the recesses 130 are formed simultaneously using the same etching process.

In some embodiments, each of the recesses 130 has slanted sidewalls. Upper portions of the recesses 130 are larger (or wider) than lower portions of the recesses 130. In these cases, due to the profile of the recesses 130, an upper semiconductor layer (such as the semiconductor layer 104d) is shorter than a lower semiconductor layer (such as the semiconductor layer 104b).

However, embodiments of the disclosure have many variations. In some other embodiments, the recesses 130 have substantially vertical sidewalls. In these cases, due to the profile of the recesses 130, an upper semiconductor layer (such as the semiconductor layer 104d) is substantially as wide as a lower semiconductor layer (such as the semiconductor layer 104b).

Figure 3D:
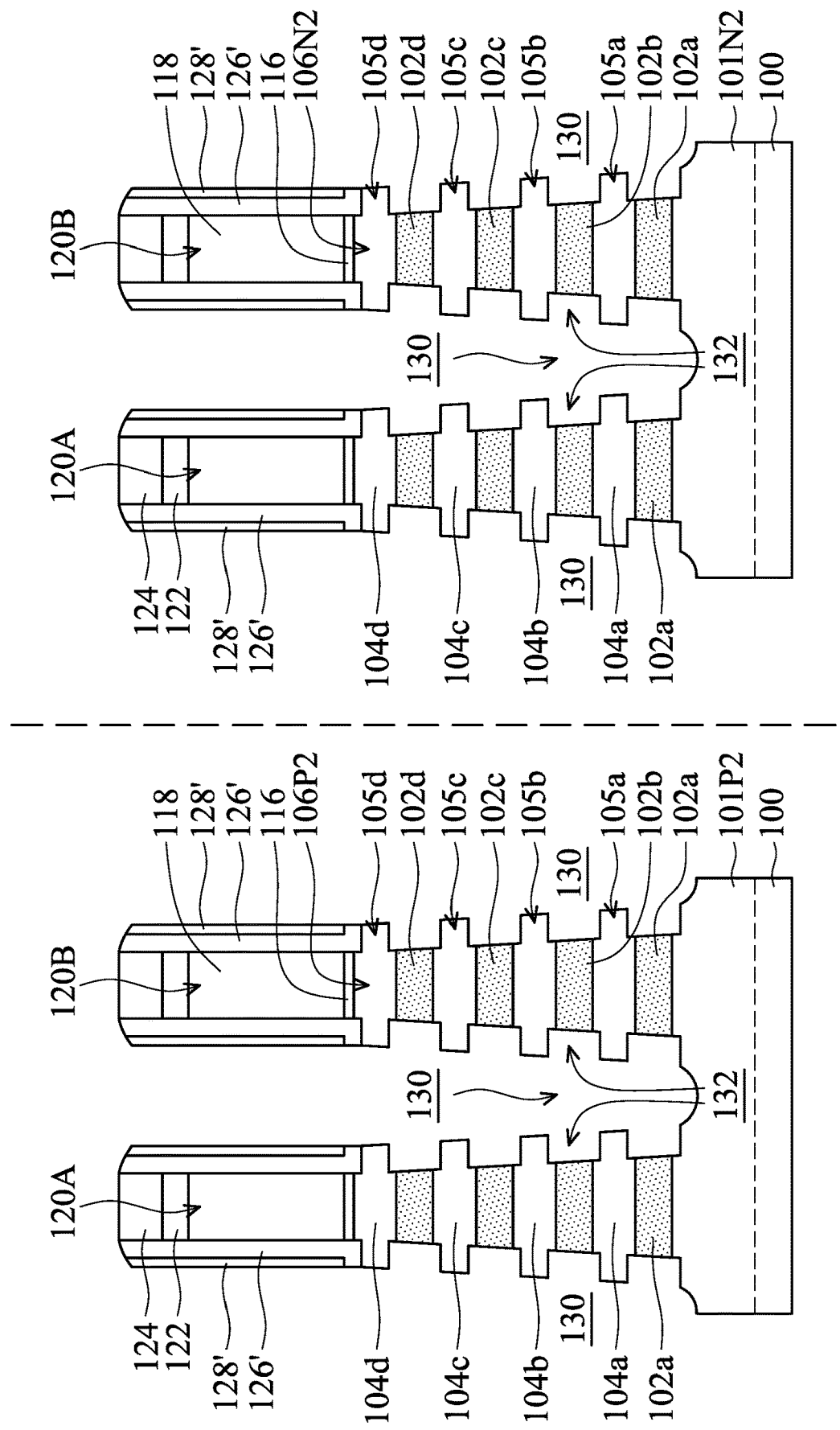

Afterwards, as shown in FIG. 3D, the semiconductor layers 102a-102d are laterally etched, in accordance with some embodiments. As a result, edges of the semiconductor layers 102a-102d retreat from edges of the semiconductor layers 104a-104d. As shown in FIG. 3D, recesses 132 are formed due to the lateral etching of the semiconductor layers 102a-102d. The recesses 132 may be used to contain inner spacers that will be formed later. The semiconductor layers 102a-102d may be laterally etched using a wet etching process, a dry etching process, or a combination thereof. In some other embodiments, the semiconductor layers 102a-102d are partially oxidized before being laterally etched.

During the lateral etching of the semiconductor layers 102a-102d, the semiconductor layers 104a-104d may also be slightly etched. As a result, edge portions of the semiconductor layers 104a-104d are partially etched and thus shrink to become edge elements 105a-105d, as shown in FIG. 3D. As shown in FIG. 3D, each of the edge elements 105a-105d of the semiconductor layers 104a-104d is thinner than the corresponding inner portion of the semiconductor layers 104a-104d.

Figure 3E:
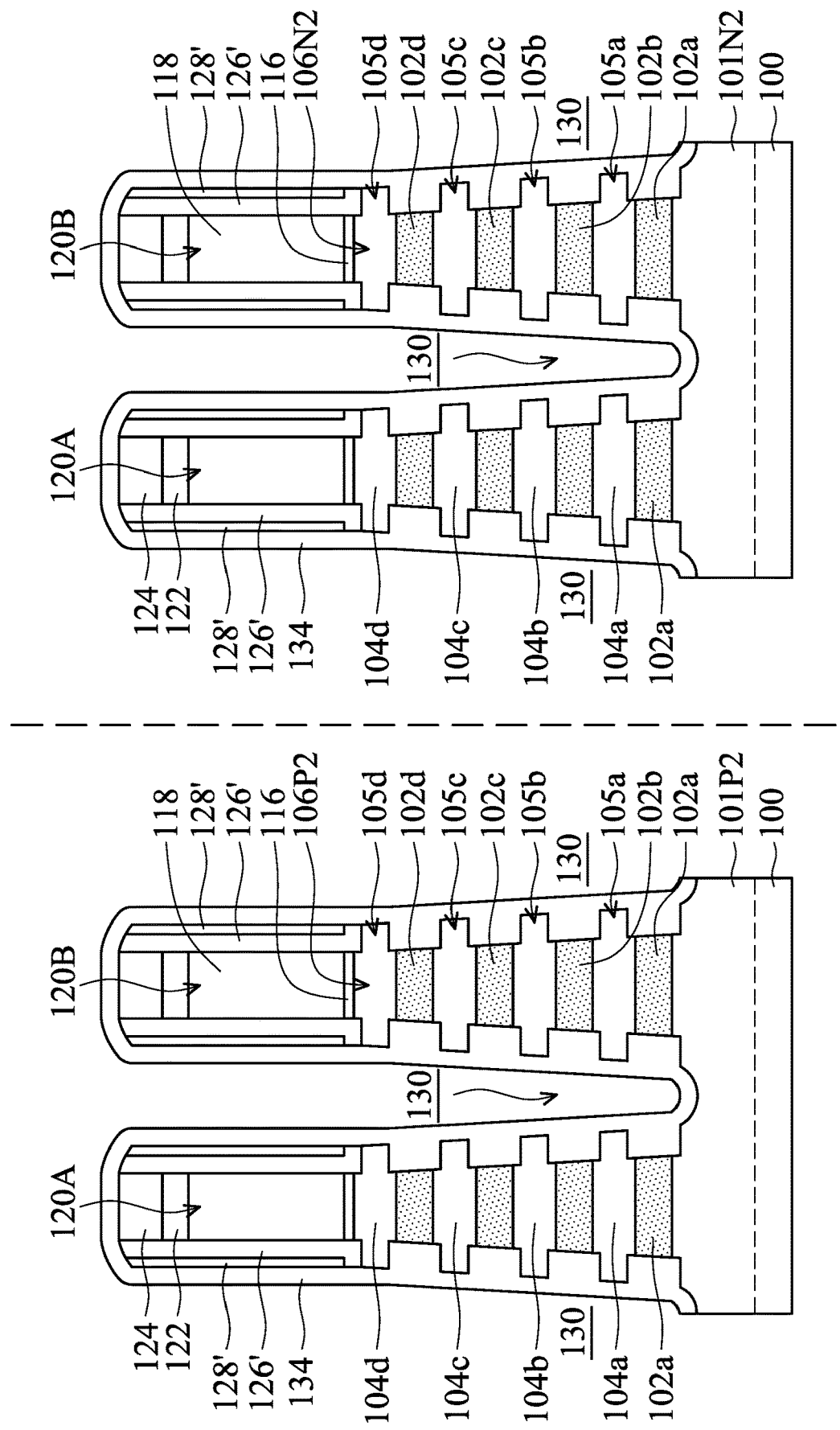

As shown in FIG. 3E, an insulating layer 134 is deposited over the structure shown in FIG. 3D, in accordance with some embodiments. The insulating layer 134 covers the dummy gate stacks 120A and 120B and fills the recesses 132. The insulating layer 134 may be made of or include carbon-containing silicon nitride (SiCN), carbon-containing silicon oxynitride (SiOCN), carbon-containing silicon oxide (SiOC), silicon oxide, silicon nitride, one or more other suitable materials, or a combination thereof. In some embodiments, the insulating layer 134 is a single layer. In some other embodiments, the insulating layer 134 includes multiple sub-layers. Some of the sub-layers may be made of different materials and/or contain different compositions. The insulating layer 134 may be deposited using a CVD process, an ALD process, one or more other applicable processes, or a combination thereof.

Figure 3F:
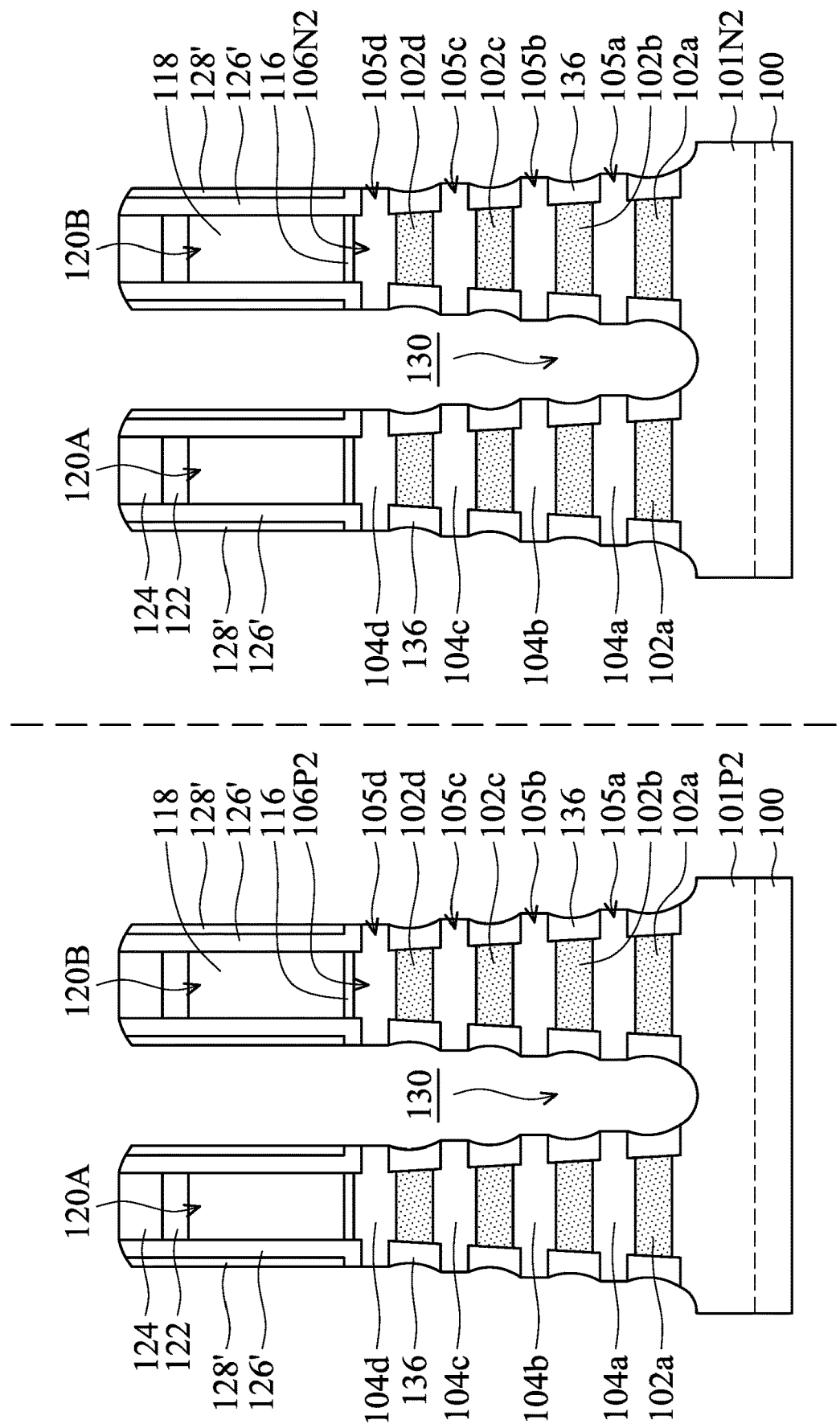

As shown in FIG. 3F, an etching process is used to partially remove the insulating layer 134, in accordance with some embodiments. The portions of the insulating layer 134 outside of the recesses 132 may be removed. The remaining portions of the insulating layer 134 form inner spacers 136, as shown in FIG. 3F. The etching process may include a dry etching process, a wet etching process, or a combination thereof.

The inner spacers 136 cover the edges of the semiconductor layers 102a-102d. The inner spacers 136 may be used to prevent subsequently formed epitaxial structures (that function as, for example, source/drain structures) from being damaged during a subsequent process for removing the sacrificial layers 102a-102d. In some embodiments, the inner spacers 136 are made of a low-k material that has a lower dielectric constant than that of silicon oxide. In these cases, the inner spacers 136 may also be used to reduce parasitic capacitance between the subsequently formed source/drain structures and the gate stacks. As a result, the operation speed of the semiconductor device structure may be improved.

In some embodiments, after the etching process for forming the inner spacers 136, portions of the semiconductor fins 101P2 and 101N2 originally covered by the insulating layer 134 are exposed by the recesses 130, as shown in FIG. 3F. The edges of the semiconductor layers 104a-104d are exposed by the recesses 130, as shown in FIG. 3F.

Figure 3G:
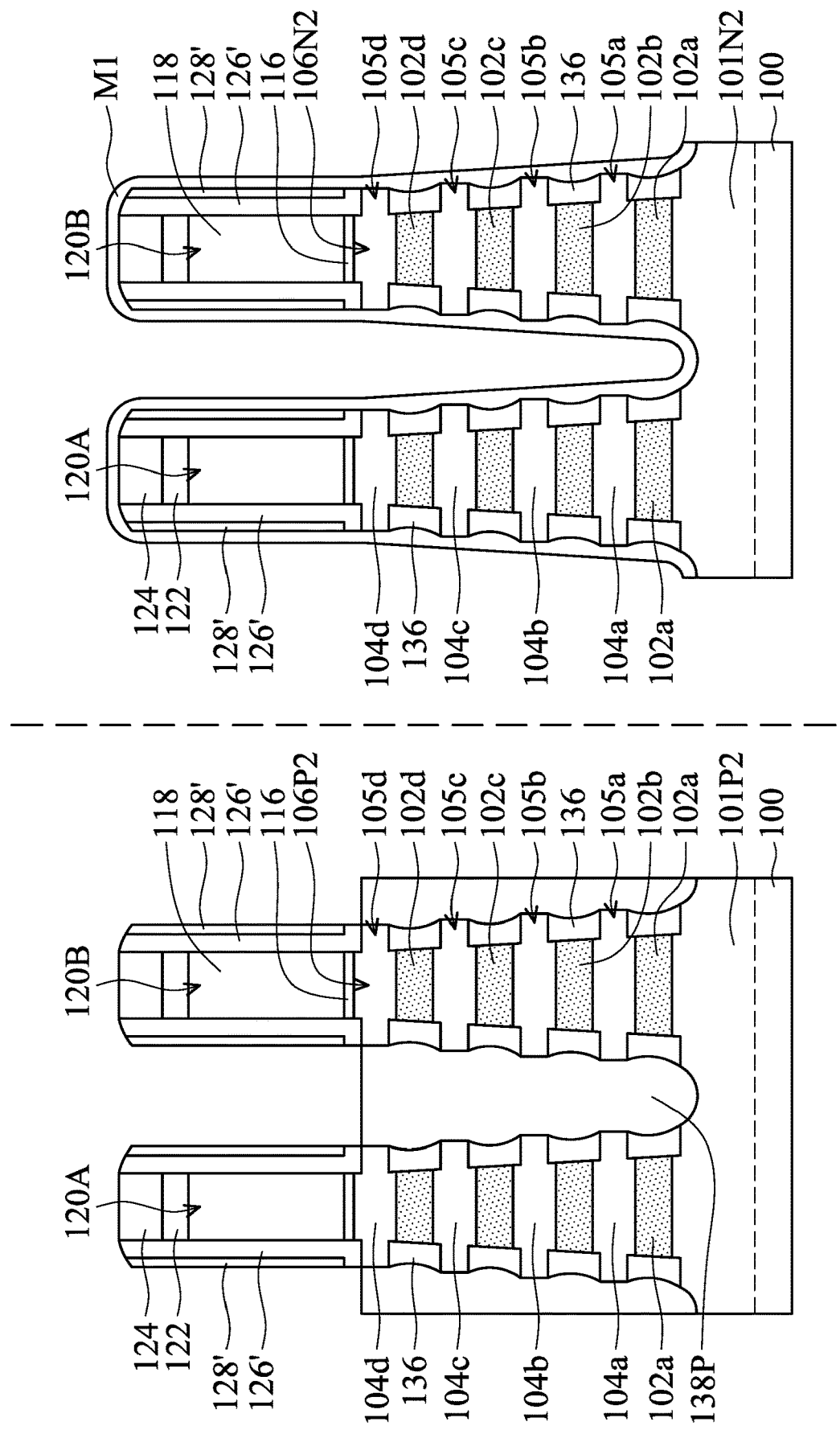
Figure 4C:
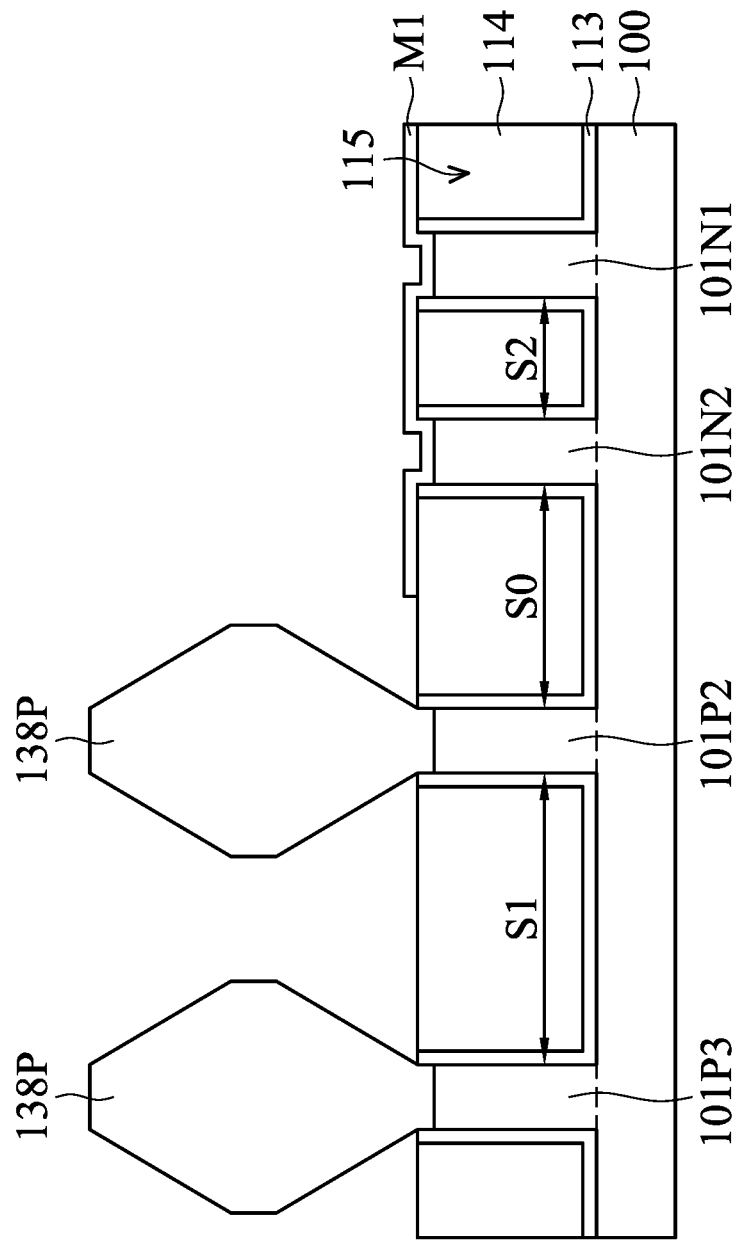

As shown in FIGS. 3G and 4C, a mask element M1 is formed to cover the semiconductor fins 101N2 and 101N1 of the fin structures 106N2 and 106N1, in accordance with some embodiments. Afterwards, epitaxial structures 138P are formed on the semiconductor fins 101P2 and 101P3 that are not covered by the mask element M1, in accordance with some embodiments. In some embodiments, the epitaxial structures 138P fill the recesses 130 that are not covered by the mask element M1, as shown in FIG. 3G. In some other embodiments, the epitaxial structures 138P overfill the recesses 130 to ensure fully contact between the epitaxial structures 138P and the semiconductor layers 104d nearby. In some embodiments, the top surfaces of the epitaxial structures 138P are higher than the top surface of the dummy gate dielectric layer 116. In some other embodiments, the epitaxial structures 138P partially fill the recesses 130.

In some embodiments, the epitaxial structures 138P connect to some of the semiconductor layers 104a-104d. Some of the semiconductor layers 104a-104d are sandwiched between the epitaxial structures 138P. In some embodiments, the epitaxial structures 138P are p-type epitaxial structures. The epitaxial structures 138P may include epitaxially grown silicon germanium (SiGe), epitaxially grown silicon, or another suitable epitaxially grown semiconductor material.

In some embodiments, the epitaxial structures 138P are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138P involves one or more etching processes that are used to fine-tune the shapes of the epitaxial structures 138P.

In some embodiments, the epitaxial structures 138P are doped with one or more suitable p-type dopants. For example, the epitaxial structures 138P are SiGe source/drain features or Si source/drain features that are doped with boron (B), gallium (Ga), indium (In), or another suitable dopant. In some embodiments, each of the epitaxial structures 138P has a first region and a second region over the first region. The second region may have a greater dopant concentration than that of the first region.

In some embodiments, the epitaxial structures 138P are doped in-situ during their epitaxial growth. The initial reaction gas mixture for forming the epitaxial structures 138P contains dopants. In some other embodiments, the epitaxial structures 138P are not doped during the growth of the epitaxial structures 138P. Instead, after the formation of the epitaxial structures 138P, the epitaxial structures 138P are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138P are further exposed to one or more annealing processes to activate the dopants. For example, a rapid thermal annealing process is used.

Figure 3H:
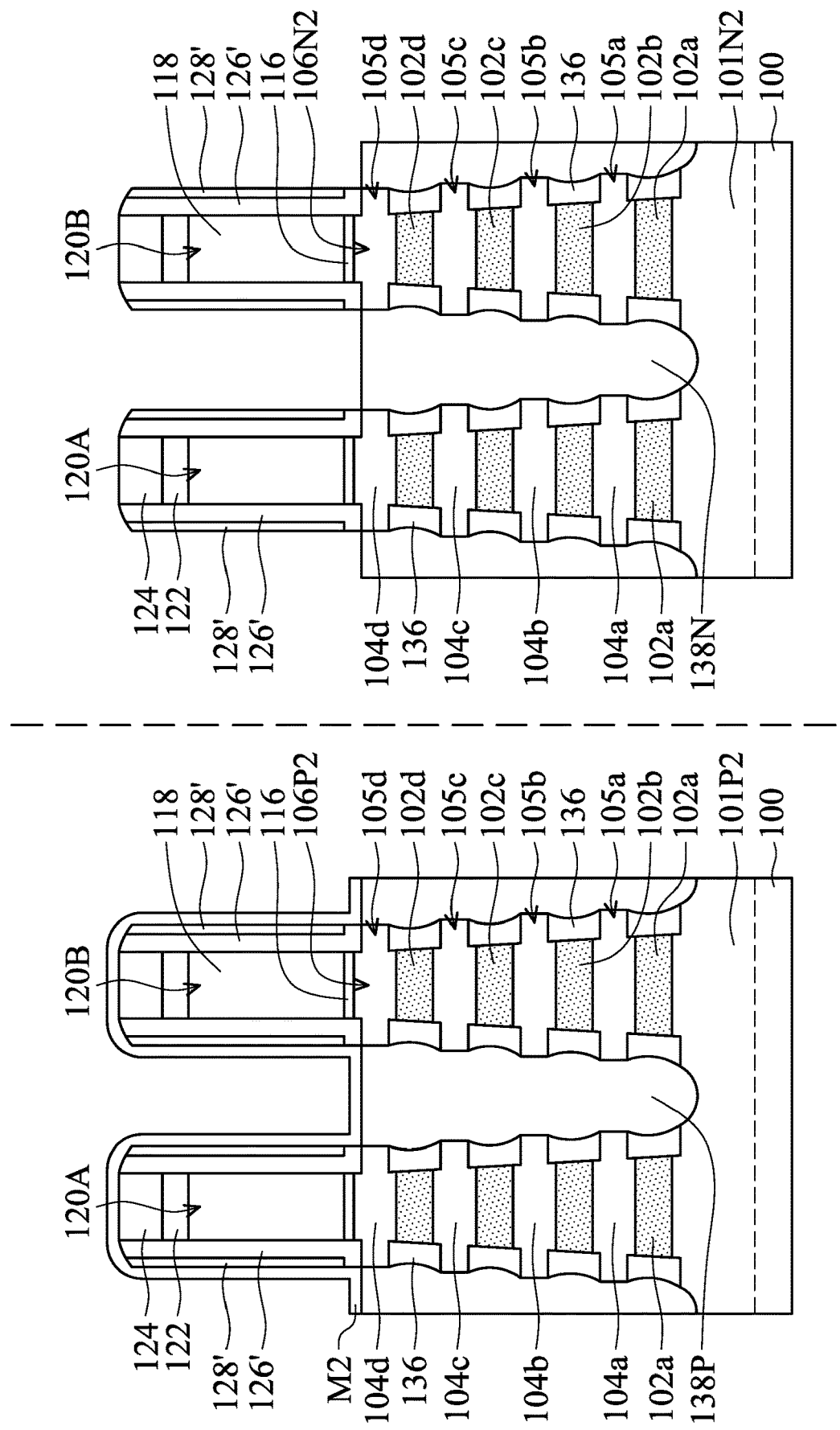
Figure 4D:
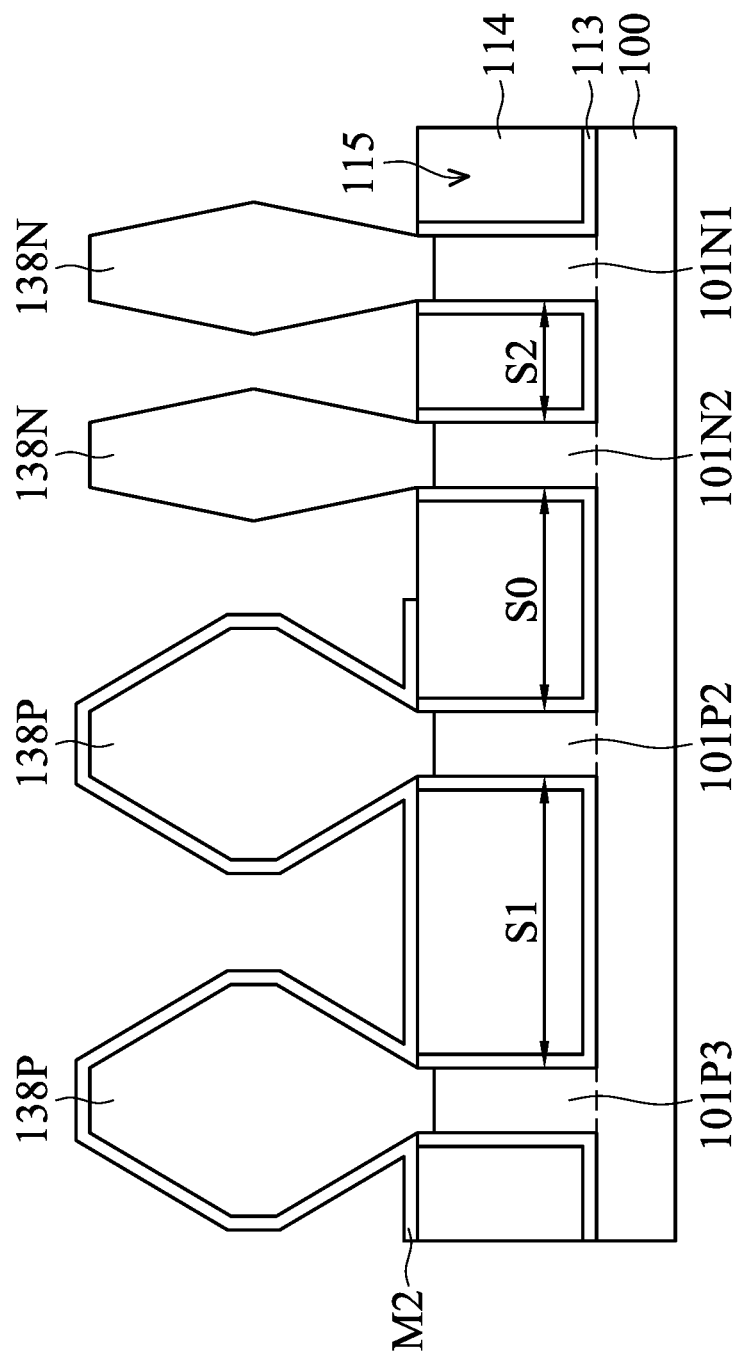

As shown in FIGS. 3H and 4D, the mask element M1 is removed, and a mask element M2 is formed to cover the epitaxial structures 138P, in accordance with some embodiments. Afterwards, epitaxial structures 138N are formed on the semiconductor fins 101N2 and 101N1 that are exposed without being covered by the mask element M2, in accordance with some embodiments. In some embodiments, the epitaxial structures 138N fill the recesses 130 that are not covered by the mask element M2, as shown in FIG. 3H. In some other embodiments, the epitaxial structures 138N overfill the recesses 130 to ensure fully contact between the epitaxial structures 138N and the semiconductor layers 104d nearby. In some embodiments, the top surfaces of the epitaxial structures 138N are higher than the top surface of the dummy gate dielectric layer 116. In some other embodiments, the epitaxial structures 138N partially fill the recesses 130.

In some embodiments, the epitaxial structures 138N connect to some of the semiconductor layers 104a-104d. Some of the semiconductor layers 104a-104d are sandwiched between the epitaxial structures 138N. In some embodiments, the epitaxial structures 138N are n-type epitaxial structures. The epitaxial structures 138N may include epitaxially grown silicon or another suitable epitaxially grown semiconductor material.

In some embodiments, the epitaxial structures 138N are formed using a selective epitaxial growth (SEG) process, a CVD process (e.g., a vapor-phase epitaxy (VPE) process, a low-pressure chemical vapor deposition (LPCVD) process, and/or an ultra-high vacuum CVD (UHV-CVD) process), a molecular beam epitaxy process, one or more other applicable processes, or a combination thereof. In some embodiments, the formation of the epitaxial structures 138N involves one or more etching processes that are used to fine-tune the shapes of the epitaxial structures 138N.

In some embodiments, the epitaxial structures 138N are doped with one or more suitable n-type dopants. For example, the epitaxial structures 138N are S Si source/drain features that are doped with phosphor (P), antimony (Sb), arsenic (As) or another suitable dopant. In some embodiments, each of the epitaxial structures 138N has a first region and a second region over the first region. The second region may have a greater dopant concentration than that of the first region.

In some embodiments, the epitaxial structures 138N are doped in-situ during their epitaxial growth. The initial reaction gas mixture for forming the epitaxial structures 138N contains dopants. In some other embodiments, the epitaxial structures 138N are not doped during the growth of the epitaxial structures 138N. Instead, after the formation of the epitaxial structures 138N, the epitaxial structures 138N are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the epitaxial structures 138N are further exposed to one or more annealing processes to activate the dopants. For example, a rapid thermal annealing process is used.

In some embodiments illustrated in FIGS. 3G-3H and 4D, the epitaxial structures 138P are formed before the epitaxial structures 138N. However, embodiments of the disclosure are not limited thereto. Many variations and/or modifications can be made to embodiments of the disclosure. In some other embodiments, the epitaxial structures 138N are formed before the epitaxial structures 138P.

Figure 4E:
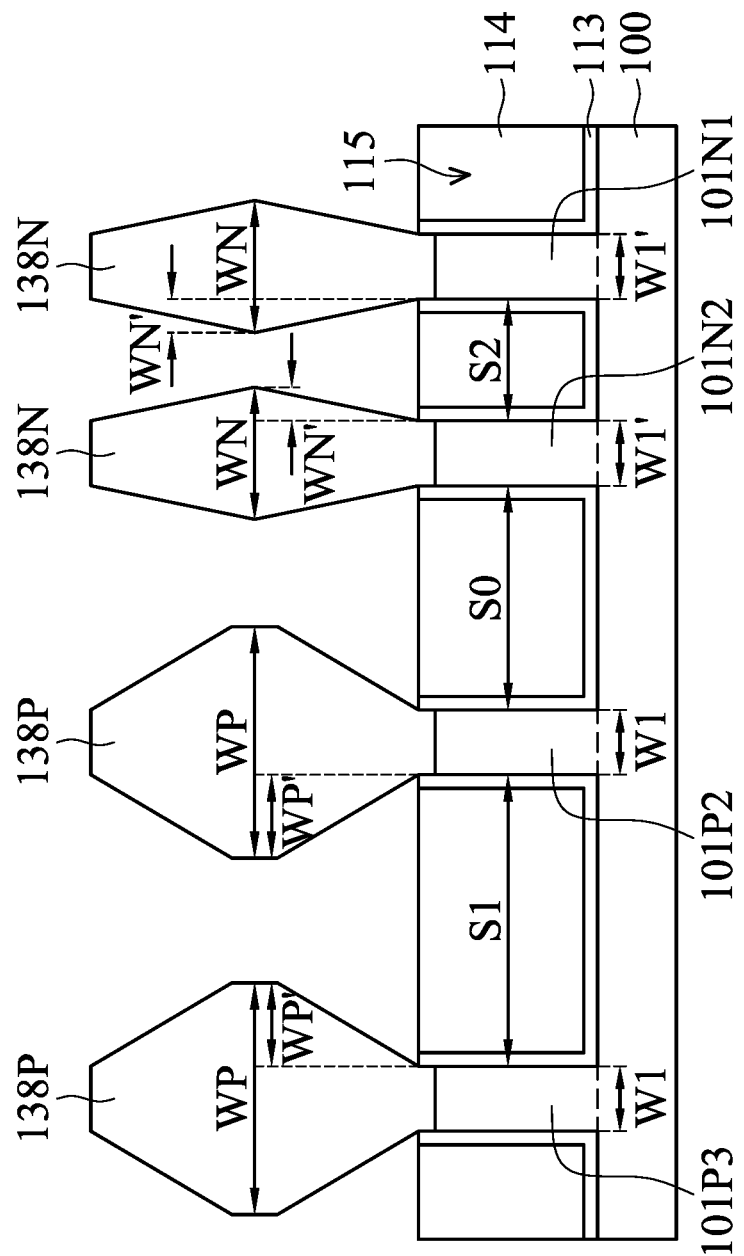

Afterwards, the mask element M2 is removed, as shown in FIG. 4E in accordance with some embodiments. The epitaxial structures 138N are thus exposed.

As shown in FIG. 4E, the width W1 of the semiconductor fins 101P3 and 101P2 is substantially equal to the width W1' of the semiconductor fins 101N2 and 101N1. In some embodiments, each of the epitaxial structures 138P is wider than each of the epitaxial structures 138N, as shown in FIG. 4E. As shown in FIG. 4E, the width WP of the epitaxial structures 138P is greater than the width WN of the epitaxial structures 138N.

As shown in FIG. 4E, due to the crystal orientation of the epitaxial structures 138P, each of the epitaxial structures 138P is laterally grown towards the nearby fin structures by the distance WP'. Similarly, due to the crystal orientation of the epitaxial structures 138N, each of the epitaxial structures 138N is laterally grown towards the nearby fin structures by the distance WN'. In some embodiments, the distance WP' is greater than the distance WN'.

In some embodiments, the lateral distance S1 is designed to be greater than the lateral distance S0. There is more space between the semiconductor fins 101P3 and 101P2 for the growth of the epitaxial structures 138P. Even if the epitaxial structures 138P are wider, the nearby epitaxial structures 138P are prevented from merging together. The performance and reliability of the semiconductor device structure are ensured.

In some embodiments, in order to keep the same cell height, the lateral distance S2 is designed to be shorter than the lateral distance S0. Even if the lateral distance S2 is shorter, the nearby epitaxial structures 138N are still prevented from merging together since epitaxial structures 138N are naturally narrower than the epitaxial structures 138P. The epitaxial structures 138N and 138P are prevented from merging together while the cell height is kept the same. The performance and reliability of the semiconductor device structure are ensured.

Figure 3I:
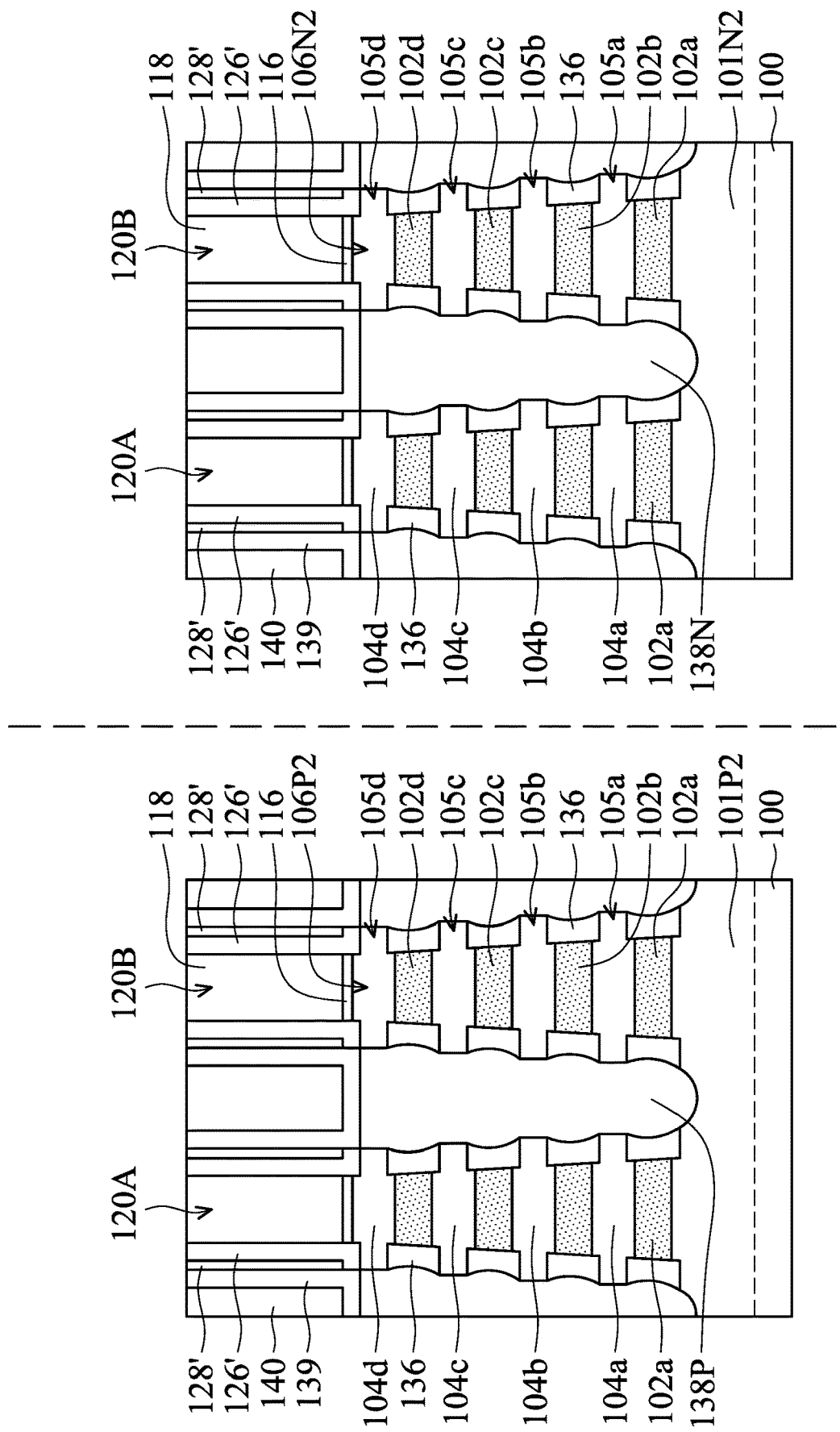
Figure 4F:
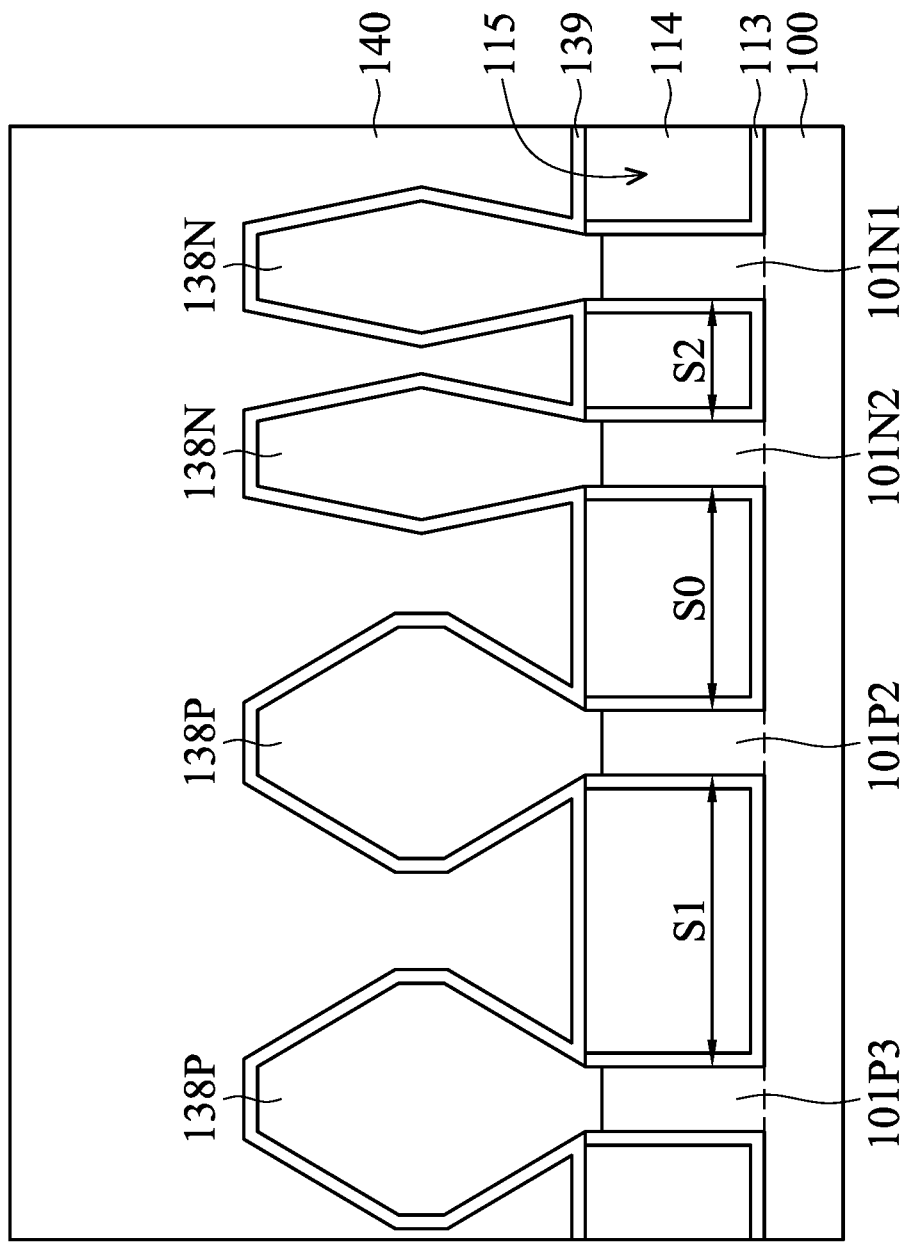

Afterwards, as shown in FIGS. 3I and 4F, a contact etch stop layer 139 and a dielectric layer 140 are formed to cover the epitaxial structures 138P and 138N, and to surround the dummy gate stacks 120A and 120B, in accordance with some embodiments. The contact etch stop layer 139 may be made of or include silicon nitride, silicon oxynitride, silicon carbide, aluminum oxide, one or more other suitable materials, or a combination thereof. The dielectric layer 140 may be made of or include silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other suitable materials, or a combination thereof.

In some embodiments, an etch stop material layer and a dielectric material layer are sequentially deposited. The etch stop material layer may be deposited using a CVD process, an ALD process, a PVD process, one or more other applicable processes, or a combination thereof. The dielectric material layer may be deposited using an FCVD process, a CVD process, an ALD process, one or more other applicable processes, or a combination thereof.

Afterwards, a planarization process is used to partially remove the etch stop material layer and the dielectric material layer. As a result, the remaining portions of the etch stop material layer and the dielectric material layer respectively form the contact etch stop layer 139 and the dielectric layer 140, as shown in FIGS. 3I and 4F. The planarization process may include a CMP process, a grinding process, an etching process, a dry polishing process, one or more other applicable processes, or a combination thereof. In some embodiments, the mask layers 122 and 124 are removed during the planarization process. In some embodiments, after the planarization process, the top surfaces of the contact etch stop layer 139, the dielectric layer 140, and the dummy gate electrodes 118 are substantially level.

Figure 3J:
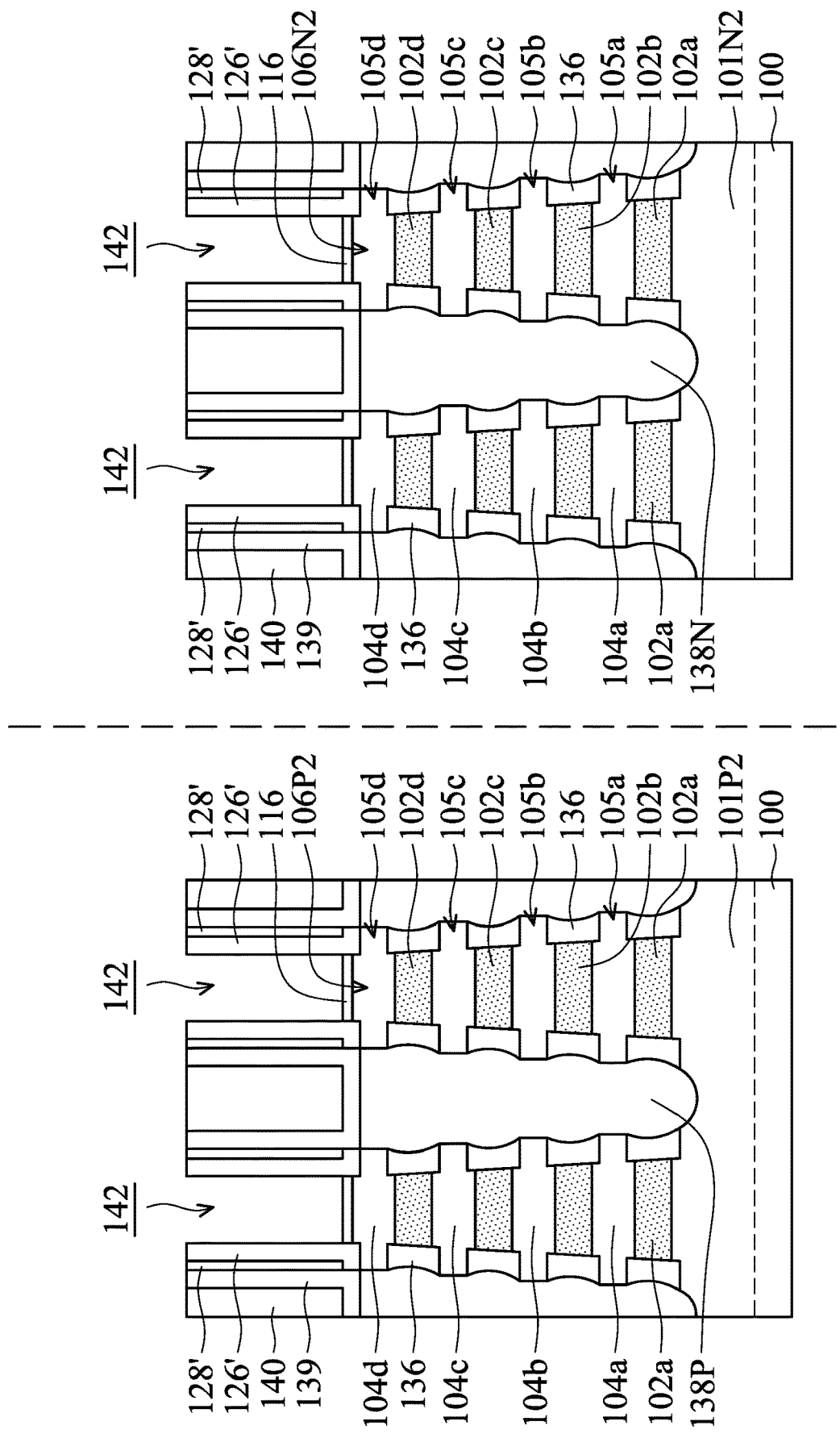

Afterwards, as shown in FIG. 3J, the dummy gate electrodes 118 are removed to form trenches 142 using one or more etching processes, in accordance with some embodiments. The trenches 142 are surrounded by the dielectric layer 140. The trenches 142 expose the dummy gate dielectric layer 116.

Figure 3K:
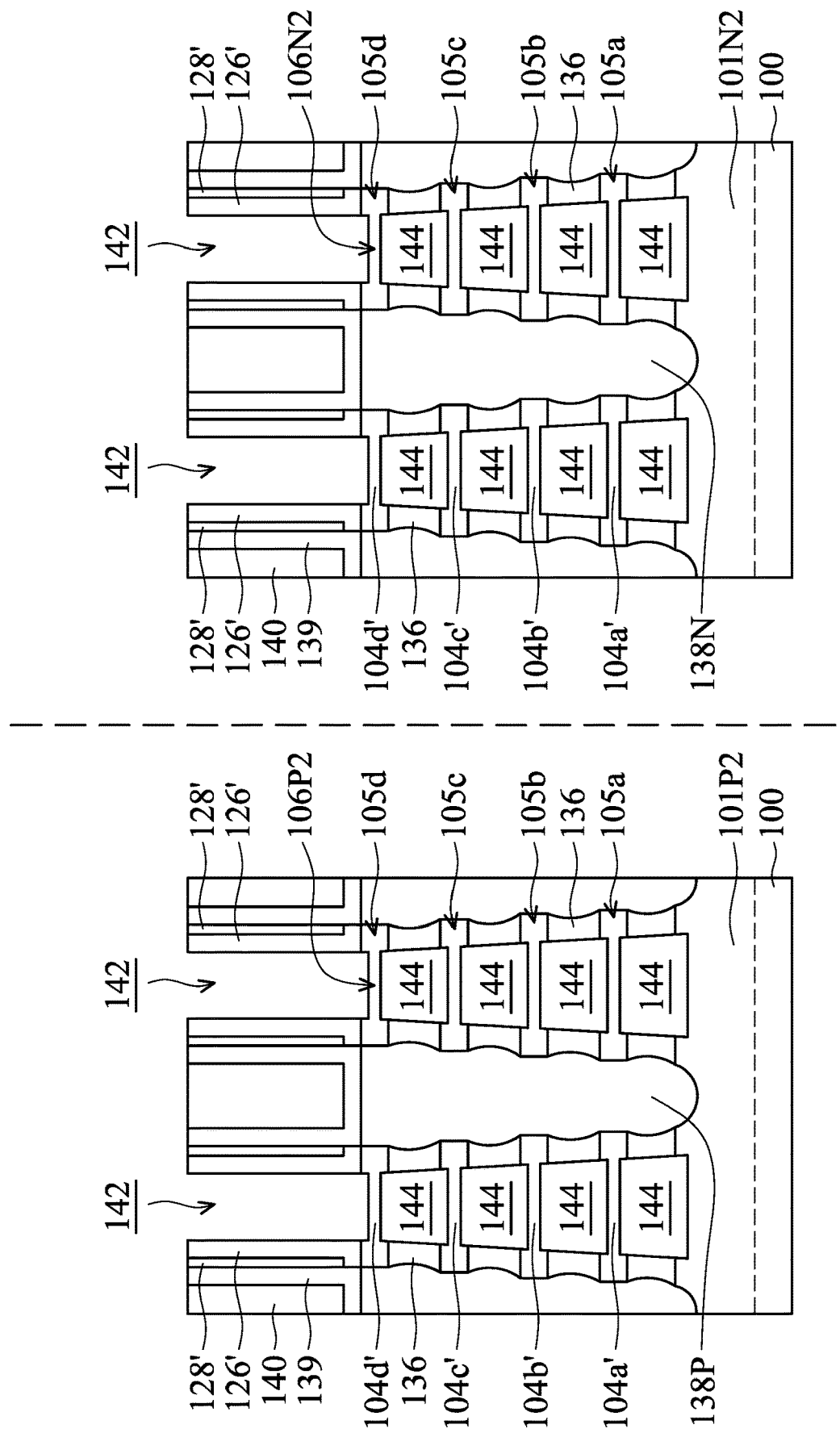

As shown in FIG. 3K, the dummy gate dielectric layer 116 and the semiconductor layers 102a-102d (that function as sacrificial layers) are removed, in accordance with some embodiments. In some embodiments, one or more etching processes are used to remove the dummy gate dielectric layer 116 and the semiconductor layers 102a-102d. As a result, recesses 144 are formed, as shown in FIG. 3K.

Due to high etching selectivity, the semiconductor layers 104a-104d are slightly (or substantially not) etched. The remaining portions of the semiconductor layers 104a-104d form multiple semiconductor nanostructures 104a'-104d'. The semiconductor nanostructures 104a'-104d' are constructed by or made up of the remaining portions of the semiconductor layers 104a-104d. The semiconductor nanostructures 104a'-104d' suspended over the semiconductor fins 101P2 and 101N2 may function as channel structures of transistors.

In some embodiments, the etchant used for removing the semiconductor layers 102a-102d also slightly removes the semiconductor layers 104a-104d that form the semiconductor nanostructures 104a'-104d'. As a result, the obtained semiconductor nanostructures 104a'-104d' become thinner after the removal of the semiconductor layers 102a-102d. In some embodiments, each of the semiconductor nanostructures 104a'-104d' is thinner than the edge portions 105a-105d since the edge portions 105a-105d are surrounded by other elements and thus are prevented from being reached and etched by the etchant.

After the removal of the semiconductor layers 102a-102d (that function as sacrificial layers), the recesses 144 are formed. The recesses 144 connect to the trench 142 and surround each of the semiconductor nanostructures 104a'-104d'. As shown in FIG. 3K, even if the recesses 144 between the semiconductor nanostructures 104a'-104d' are formed, the semiconductor nanostructures 104a'-104d' remain being held by the epitaxial structures 138P or 138N. Therefore, after the removal of the semiconductor layers 102a-102d (that function as sacrificial layers), the released semiconductor nanostructures 104a'-104d' are prevented from falling down.

During the removal of the semiconductor layers 102a-102d (that function as sacrificial layers), the inner spacers 136 protect the epitaxial structures 138P and 138N from being etched or damaged. The quality and reliability of the semiconductor device structure are improved.

Figure 3L:
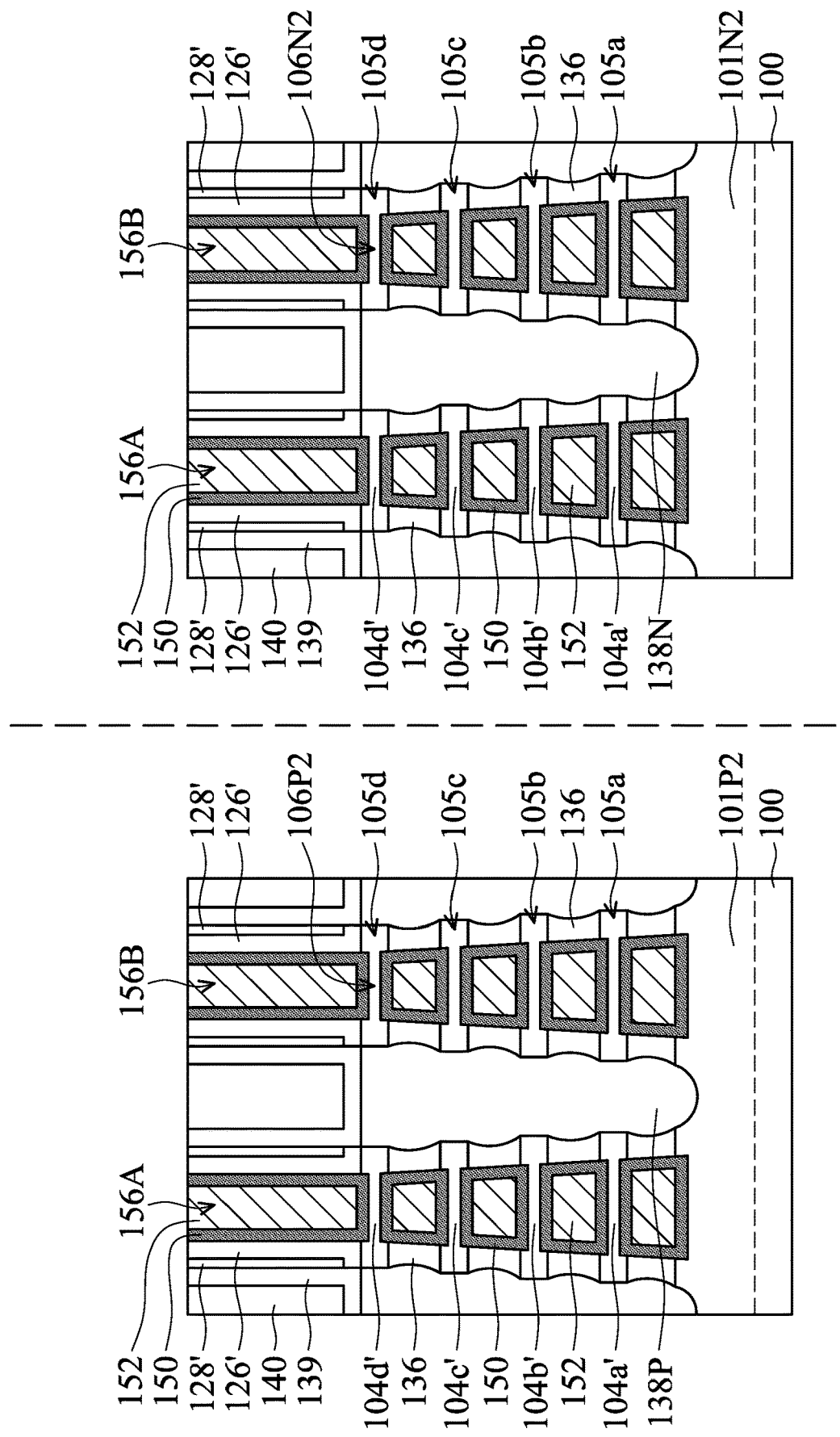

As shown in FIG. 3L, metal gate stacks 156A and 156B are formed to fill the trenches 142, in accordance with some embodiments. The metal gate stacks 156A and 156B further extend into the recesses 144 to wrap around each of the semiconductor nanostructures 104a'-104d'.

Each of the metal gate stacks 156A and 156B includes multiple metal gate stack layers. Each of the metal gate stacks 156A and 156B may include a gate dielectric layer 150 and a metal gate electrode 152. The metal gate electrode 152 may include a work function layer. The metal gate electrode 152 may further include a conductive filling. In some embodiments, the formation of the metal gate stacks 156A and 156B involves the deposition of multiple metal gate stack layers over the dielectric layer 140 to fill the trenches 142 and the recesses 144. The metal gate stack layers extend into the recesses 144 to wrap around each of the semiconductor nanostructures 104a'-104d'.

In some embodiments, the gate dielectric layer 150 is made of or includes a dielectric material with high dielectric constant (high-K). The gate dielectric layer 150 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K materials, or a combination thereof. The gate dielectric layer 150 may be deposited using an ALD process, a CVD process, one or more other applicable processes, or a combination thereof.

In some embodiments, before the formation of the gate dielectric layer 150, an interfacial layers are formed on the surfaces of the semiconductor nanostructures 104a'-104d'. The interfacial layers are very thin and are made of, for example, silicon oxide or germanium oxide. In some embodiments, the interfacial layers are formed by applying an oxidizing agent on the surfaces of the semiconductor nanostructures 104a'-104d'. For example, a hydrogen peroxide-containing liquid may be applied or provided on the surfaces of the semiconductor nanostructures 104a'-104d' so as to form the interfacial layers.

The work function layer of the metal gate electrode 152 may be used to provide the desired work function for transistors to enhance device performance including improved threshold voltage. In some embodiments, the work function layer is used for forming a PMOS device. The work function layer is a p-type work function layer. The p-type work function layer is capable of providing a work function value suitable for the device, such as equal to or greater than about 4.8 eV. For example, the work function layer surrounding the semiconductor nanostructures 104a'-104d' between the epitaxial structures 138P is a p-type work function layer.

The p-type work function layer may include metal, metal carbide, metal nitride, other suitable materials, or a combination thereof. For example, the p-type metal includes tantalum nitride, tungsten nitride, titanium, titanium nitride, one or more other suitable materials, or a combination thereof.

In some embodiments, the work function layer is used for forming an NMOS device. The work function layer is an n-type work function layer. The n-type work function layer is capable of providing a work function value suitable for the device, such as equal to or less than about 4.5 eV. For example, the work function layer surrounding the semiconductor nanostructures 104a'-104d' sandwiched between the epitaxial structures 138N is an n-type work function layer.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC. TiAlO, TiAlN, one or more other suitable materials, or a combination thereof.

The work function layer may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be fine-tuned to adjust the work function level.

The work function layer may be deposited over the gate dielectric layer 150 using an ALD process, a CVD process, a PVD process, an electroplating process, an electroless plating process, one or more other applicable processes, or a combination thereof. In some embodiments, the formation of the work function layer involves one or more patterning processes. As a result, the n-type work function layer and the n-type work function layer are selectively formed over different regions.

In some embodiments, a barrier layer is formed before the work function layer to interface the gate dielectric layer 150 with the subsequently formed work function layer. The barrier layer may also be used to prevent diffusion between the gate dielectric layer 150 and the subsequently formed work function layer. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

In some embodiments, the conductive fillings of the metal gate electrodes 152 are made of or include a metal material. The metal material may include tungsten, aluminum, copper, cobalt, one or more other suitable materials, or a combination thereof. A conductive layer used for forming the conductive filling may be deposited over the work function layer using a CVD process, an ALD process, a PVD process, an electroplating process, an electroless plating process, a spin coating process, one or more other applicable processes, or a combination thereof.

In some embodiments, a blocking layer is formed over the work function layer before the formation of the conductive layer used for forming the conductive filling. The blocking layer may be used to prevent the subsequently formed conductive layer from diffusing or penetrating into the work function layer. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Afterwards, a planarization process is performed to remove the portions of the metal gate stack layers outside of the trenches 142, in accordance with some embodiments. As a result, the remaining portions of the metal gate stack layers form the metal gate stacks 156A and 156B, as shown in FIG. 3L.

In some embodiments, the conductive filling does not extend into the recesses 144 since the recesses 144 are small and have been filled with other elements such as the gate dielectric layer 150 and the work function layer. However, embodiments of the disclosure are not limited thereto. In some other embodiments, a portion of the conductive filling extends into the recesses 144, especially for the lower recesses 144 that may have larger space.

Figure 4G:
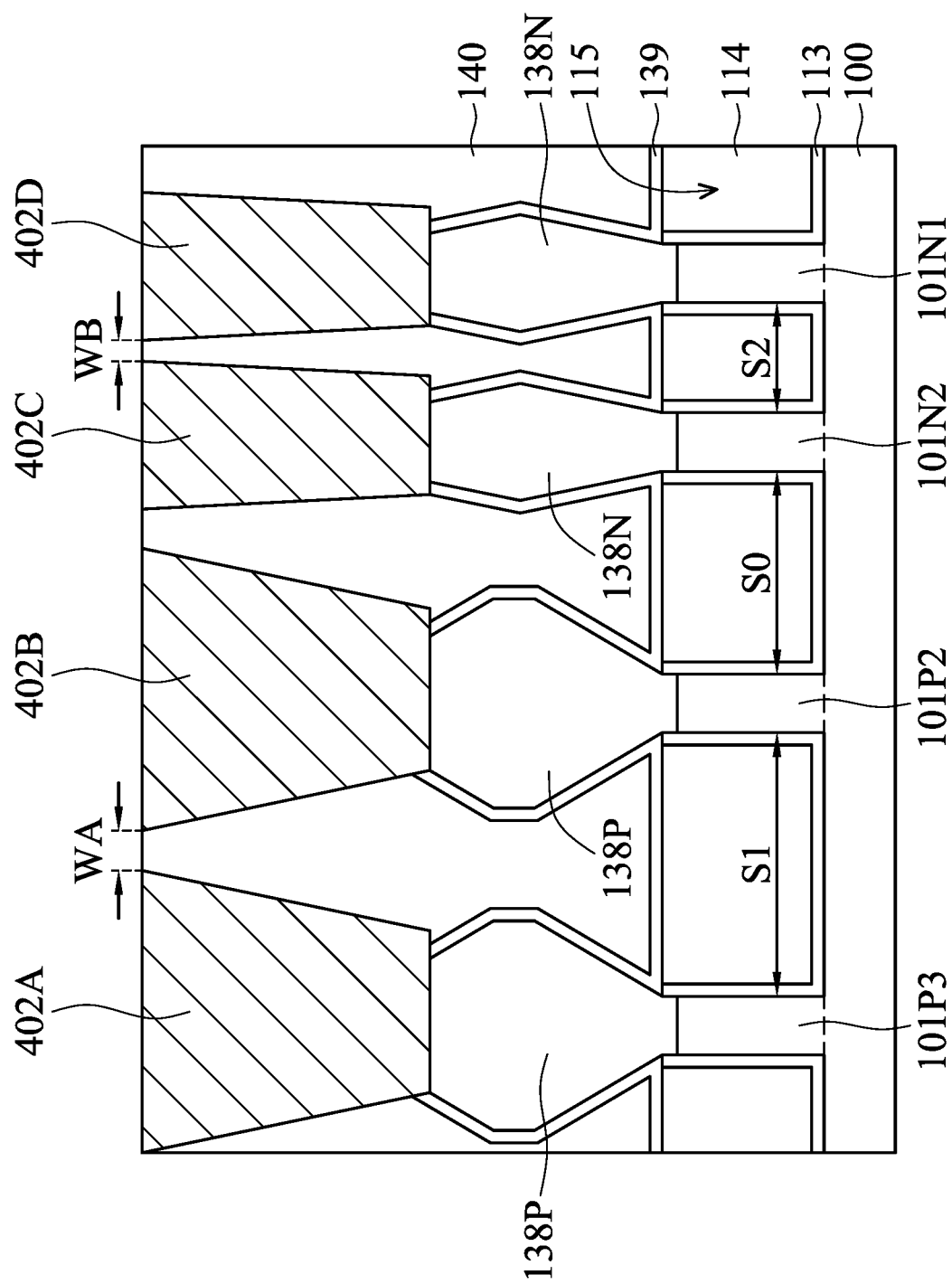

Afterwards, as shown in FIG. 4G, conductive contacts 402A, 402B, 402C, and 402D are formed in the dielectric layer 140, in accordance with some embodiments. The conductive contacts 402A, 402B, 402C, and 402D provide respective electrical connections to the epitaxial structures 138P or 138N thereunder. The conductive contacts 402A-402D may be made of or include cobalt, tungsten, ruthenium, one or more other suitable materials, or a combination thereof.

In some embodiments, before the formation of the conductive contacts 402A-402D, multiple contact openings used for containing the conductive contacts 402A-402D are formed in the dielectric layer 140. In some embodiments, a patterned photoresist element and a patterned mask element are used together for defining the contact openings. Afterwards, one or more etching processes are used to partially remove the dielectric layer 140 and the contact etch stop layer 139. In some embodiments, the epitaxial structures 138P and 138N are also partially removed during the formation of the contact openings.

In some embodiments, after the formation of the conductive openings, metal-semiconductor compound elements are formed on the epitaxial structures 138P and 138N, so as to improve electrical connection between the subsequently formed conductive contacts and the epitaxial structures.

Afterwards, one or more conductive materials are formed to overfill the contact openings, in accordance with some embodiments. The conductive materials outside of the contact openings are then removed. As a result, the remaining portions of the conductive materials form the conductive contacts 402A-402D.

As shown in FIG. 4G, the portion of the dielectric layer 140 between the conductive contacts 402A and 402B is used to electrically isolate the conductive contacts 402A and 402B from each other. The portion of the dielectric layer 140 between the conductive contacts 402A and 402B has a width WA. The portion of the dielectric layer 140 between the conductive contacts 402C and 402D is used to electrically isolate the conductive contacts 402C and 402D from each other. The portion of the dielectric layer 140 between the conductive contacts 402C and 402D has a width WB. In some embodiments, the width WA is greater than the width WB.

However, embodiments of the disclosure are not limited thereto. Many variations and/or modifications can be made to embodiments of the disclosure. In some other embodiments, the width WA is substantially equal to the width WB.

Figure 4H:
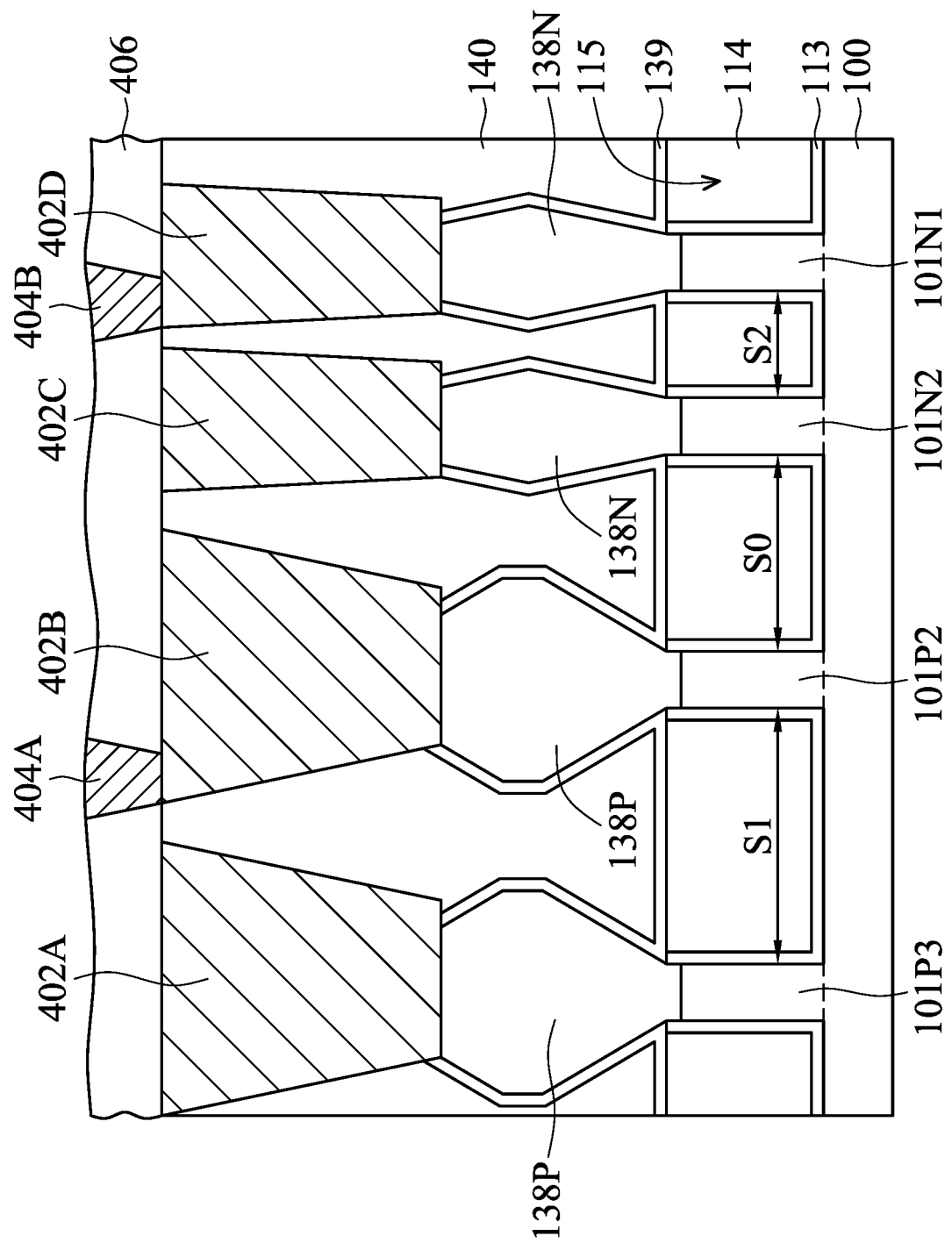

As shown in FIG. 4H, a dielectric layer 406 and conductive vias 404A and 404B are formed, in accordance with some embodiments. The conductive via 404A may be used to form electrical connection between the conductive contact 402B and another conductive feature (such as a conductive line) that will be formed over the conductive via 404A. The conductive via 404B may be used to form electrical connection between the conductive contact 402D and another conductive feature (such as a conductive line) that will be formed over the conductive via 404B. In some embodiments, the conductive via 404A is substantially as wide as the conductive via 404B.

Many variations and/or modifications can be made to embodiments of the disclosure. Embodiments of the disclosure may be applied to both the GAA device and the FinFET device.

Embodiments of the disclosure form a semiconductor device structure with wider epitaxial structures and narrower epitaxial structures. The distance between nearby fin structures where the wider epitaxial structures are designed to be formed is set to be wider while the distance between nearby fin structures where the narrower epitaxial structures are designed to be formed is set to be narrower. As a result, each of the wider epitaxial structures and narrower epitaxial structures are prevented from merging together. The performance and reliability of the semiconductor device structure may therefore be improved.

In accordance with some embodiments, a method for forming a semiconductor device structure is provided. The method includes forming a first fin structure, a second fin structure, a third fin structure, and a fourth fin structure over a substrate. The second fin structure is between the first fin structure and the third fin structure, and the third fin structure is between the second fin structure and the fourth fin structure. A first lateral distance between the first fin structure and the second fin structure is greater than a second lateral distance between the third fin structure and the fourth fin structure. The method also includes forming a first p-type epitaxial structure over the first fin structure and forming a second p-type epitaxial structure over the second fin structure. The method further includes forming a first n-type epitaxial structure over the third fin structure and forming a second n-type epitaxial structure over the fourth fin structure.

In accordance with some embodiments, a method for forming a semiconductor device structure is provided. The method includes forming a first semiconductor protruding structure, a second semiconductor protruding structure, a third semiconductor protruding structure, and a fourth semiconductor protruding structure over a substrate. A first lateral distance between the first semiconductor protruding structure and the second semiconductor protruding structure is greater than a second lateral distance between the third semiconductor protruding structure and the fourth semiconductor protruding structure. The method also includes forming a first epitaxial structure over the first semiconductor protruding structure and forming a second epitaxial structure over the second semiconductor protruding structure. The method further includes forming a third epitaxial structure over the third semiconductor protruding structure and forming a fourth epitaxial structure over the fourth semiconductor protruding structure. Each of the first epitaxial structure and the second epitaxial structure is wider than each of the third epitaxial structure and the fourth epitaxial structure.

In accordance with some embodiments, a semiconductor device structure is provided. The semiconductor device structure includes a first fin structure, a second fin structure, a third fin structure, and a fourth fin structure over a substrate. The second fin structure is between the first fin structure and the third fin structure, the third fin structure is between the second fin structure and the fourth fin structure. A first lateral distance between the first fin structure and the second fin structure is greater than a second lateral distance between the third fin structure and the fourth fin structure. The semiconductor device structure also includes a first p-type epitaxial structure over the first fin structure and a second p-type epitaxial structure over the second fin structure. The semiconductor device structure further includes a first n-type epitaxial structure over the third fin structure and a second n-type epitaxial structure over the fourth fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
    forming a first fin structure, a second fin structure, a third fin structure, and a fourth fin structure over a substrate, wherein the second fin structure is between the first fin structure and the third fin structure, the third fin structure is between the second fin structure and the fourth fin structure, a first lateral distance between the first fin structure and the second fin structure is greater than a second lateral distance between the third fin structure and the fourth fin structure, a third lateral distance between the second fin structure and the third fin structure is greater than the second lateral distance, and the third lateral distance is shorter than the first lateral distance;
    forming a first p-type epitaxial structure over the first fin structure;
    forming a second p-type epitaxial structure over the second fin structure;
    forming a first n-type epitaxial structure over the third fin structure; and
    forming a second n-type epitaxial structure over the fourth fin structure.

2. The method for forming a semiconductor device structure as claimed in claim 1, wherein the first p-type epitaxial structure and the second p-type epitaxial structure are formed simultaneously before the formation of the first n-type epitaxial structure and the second n-type epitaxial structure.

3. The method for forming a semiconductor device structure as claimed in claim 1, wherein the first p-type epitaxial structure is formed to be wider than the first n-type epitaxial structure or the second n-type epitaxial structure, and the second p-type epitaxial structure is formed to be wider than the first n-type epitaxial structure or the second n-type epitaxial structure.

4. The method for forming a semiconductor device structure as claimed in claim 1, wherein the first fin structure, the second fin structure, the third fin structure, and the fourth fin structure are formed to be as wide as one another.

5. The method for forming a semiconductor device structure as claimed in claim 1, wherein the third lateral distance is greater than the second lateral distance by a first difference, the first lateral distance is greater than the third lateral distance by a second difference, and the first difference is substantially equal to the second difference.

6. The method for forming a semiconductor device structure as claimed in claim 5, wherein a first ratio of the first lateral distance to the third lateral distance is in a range from about 1.05 to about 1.2, and a second ratio of the second lateral distance to the third lateral distance is in a range from about 0.8 to about 0.95.

7. The method for forming a semiconductor device structure as claimed in claim 1, further comprising:
    forming a gate stack extending across the first fin structure, the second fin structure, the third fin structure, and the fourth fin structure; and
    partially removing the first fin structure, the second fin structure, the third fin structure, and the fourth fin structure after the formation of the gate stack and before the formation of the first p-type epitaxial structure, the second p-type epitaxial structure, the first n-type epitaxial structure, and the second n-type epitaxial structure.

8. The method for forming a semiconductor device structure as claimed in claim 7, further comprising:
    forming a first mask element over the third fin structure and the fourth fin structure after the partial removal of the third fin structure and the fourth fin structure and before the formation of the first p-type epitaxial structure and the second p-type epitaxial structure;
    removing the first mask element; and
    forming a second mask element over the first p-type epitaxial structure and the second p-type epitaxial structure before the formation of the first n-type epitaxial structure and the second n-type epitaxial structure.

9. The method for forming a semiconductor device structure as claimed in claim 1, wherein the second p-type epitaxial structure is formed to be separate from the first p-type epitaxial structure and the first n-type epitaxial structure.

10. A method for forming a semiconductor device structure, comprising:
    forming a first semiconductor protruding structure, a second semiconductor protruding structure, a third semiconductor protruding structure, and a fourth semiconductor protruding structure over a substrate, wherein a first lateral distance between the first semiconductor protruding structure and the second semiconductor protruding structure is greater than a second lateral distance between the third semiconductor protruding structure and the fourth semiconductor protruding structure, a third lateral distance between the second semiconductor protruding structure and the third semiconductor protruding structure is greater than the second lateral distance, and the third lateral distance is shorter than the first lateral distance;

forming a first epitaxial structure over the first semiconductor protruding structure;

forming a second epitaxial structure over the second semiconductor protruding structure;

forming a third epitaxial structure over the third semiconductor protruding structure; and forming a fourth epitaxial structure over the fourth semiconductor protruding structure, wherein each of the first epitaxial structure and the second epitaxial structure is wider than each of the third epitaxial structure and the fourth epitaxial structure.

11. The method for forming a semiconductor device structure as claimed in claim 10, wherein the third lateral distance is greater than the second lateral distance by a first difference, the first lateral distance is greater than the third lateral distance by a second difference, and the first difference is substantially equal to the second difference.

12. The method for forming a semiconductor device structure as claimed in claim 11, wherein a first ratio of the first lateral distance to the third lateral distance is in a range from about 1.05 to about 1.2, and a second ratio of the second lateral distance to the third lateral distance is in a range from about 0.8 to about 0.95.

13. The method for forming a semiconductor device structure as claimed in claim 10, wherein the first epitaxial structure and the second epitaxial structure are formed simultaneously, the third epitaxial structure and the fourth epitaxial structure are formed simultaneously, and the second epitaxial structure and the third epitaxial structure are not formed simultaneously.

14. A semiconductor device structure, comprising:

a first fin structure, a second fin structure, a third fin structure, and a fourth fin structure over a substrate, wherein the second fin structure is between the first fin structure and the third fin structure, the third fin structure is between the second fin structure and the fourth fin structure, a first lateral distance between the first fin structure and the second fin structure is greater than a second lateral distance between the third fin structure and the fourth fin structure, a third lateral distance between the second fin structure and the third fin structure is greater than the second lateral distance, and the third lateral distance is shorter than the first lateral distance;

a first p-type epitaxial structure over the first fin structure;

a second p-type epitaxial structure over the second fin structure;

a first n-type epitaxial structure over the third fin structure; and a second n-type epitaxial structure over the fourth fin structure.

15. The semiconductor device structure as claimed in claim 14, wherein the second p-type epitaxial structure is wider than the first n-type epitaxial structure.

16. The semiconductor device structure as claimed in claim 14, wherein the first fin structure is substantially as wide as the third fin structure.

17. The semiconductor device structure as claimed in claim 14, wherein the third lateral distance is greater than the second lateral distance by a first difference, the first lateral distance is greater than the third lateral distance by a second difference, and the first difference is substantially equal to the second difference.

18. The semiconductor device structure as claimed in claim 14, further comprising:

a first conductive contact electrically connected to the first p-type epitaxial structure;

a second conductive contact electrically connected to the second p-type epitaxial structure, wherein the second conductive contact is laterally separated from the first conductive contact by a first distance;

a third conductive contact electrically connected to the first n-type epitaxial structure; and a fourth conductive contact electrically connected to the second n-type epitaxial structure, wherein the fourth conductive contact is laterally separated from the third conductive contact by a second distance, and the second distance is different than the first distance.

19. The semiconductor device structure as claimed in claim 18, wherein the first distance is greater than the second distance.

20. The semiconductor device structure as claimed in claim 18, wherein the second conductive contact is wider than the third conductive contact.

* * * * *